(12) United States Patent
Stormberg et al.

(10) Patent No.: US 10,088,618 B2
(45) Date of Patent: Oct. 2, 2018

(54) LIGHT-EMITTING DEVICE WITH REMOTE SCATTERING ELEMENT AND TOTAL INTERNAL REFLECTION EXTRACTOR ELEMENT

(71) Applicant: Quarkstar LLC, Las Vegas, NV (US)

(72) Inventors: Hans Peter Stormberg, Stolberg (DE); Robert C. Gardner, Atherton, CA (US); Gregory A. Magel, Dallas, TX (US); Ferdinand Schinagl, North Vancouver (CA); Roland H. Haitz, Portola Valley, CA (US)

(73) Assignee: Quarkstar LLC, Las Vegas, NV (US)

( * ) Notice: Subject to any disclaimer, the term of this patent is extended or adjusted under 35 U.S.C. 154(b) by 0 days.

(21) Appl. No.: 15/076,588

(22) Filed: Mar. 21, 2016

(65) Prior Publication Data

US 2017/0038511 A1   Feb. 9, 2017

Related U.S. Application Data

(63) Continuation of application No. 14/427,944, filed as application No. PCT/US2013/059511 on Sep. 12, 2013, now Pat. No. 9,291,763.

(Continued)

(51) Int. Cl.
*F21V 8/00*   (2006.01)
*F21V 13/12*  (2006.01)
(Continued)

(52) U.S. Cl.
CPC .............. *G02B 6/0003* (2013.01); *F21K 9/00* (2013.01); *F21K 9/64* (2016.08); *F21K 9/68* (2016.08);
(Continued)

(58) Field of Classification Search
CPC .. G02B 6/0003; G02B 6/0018; G02B 6/0031; G02B 6/0043; G02B 6/0055;
(Continued)

(56) References Cited

U.S. PATENT DOCUMENTS 3,960,579 A   6/1976   Broerner
4,038,448 A   7/1977   Boyd et al.
(Continued)

FOREIGN PATENT DOCUMENTS

CN   101553928 A   10/2009
CN   102272953 A   12/2011
(Continued)

OTHER PUBLICATIONS

Allen et al., "A nearly ideal phosphor-converted white light-emitting diode," Applied Physics Letters, vol. 92 (2008) 3 pages.
(Continued)

*Primary Examiner* — Alan Cariaso
(74) *Attorney, Agent, or Firm* — Fish & Richardson P.C.

(57) ABSTRACT

A variety of light-emitting devices are disclosed that are configured to output light provided by a light-emitting element (LEE). In general, embodiments of the light-emitting devices feature a light-emitting element, a scattering element that is spaced apart from the light-emitting element and an extractor element coupled to the scattering element, where the extractor element includes, at least in part, a total internal reflection surface. Luminaires incorporating light-emitting devices of this type are also disclosed.

29 Claims, 10 Drawing Sheets

US 10,088,618 B2

Page 2

Related U.S. Application Data

(60) Provisional application No. 61/826,434, filed on May 22, 2013, provisional application No. 61/700,724, filed on Sep. 13, 2012.

(51) Int. Cl.

| | |
|---|---|
| *F21K 9/00* | (2016.01) |
| *H01L 33/50* | (2010.01) |
| *F21S 8/00* | (2006.01) |
| *F21V 7/00* | (2006.01) |
| *G02B 5/02* | (2006.01) |
| *G02B 19/00* | (2006.01) |
| *F21V 5/04* | (2006.01) |
| *F21K 9/64* | (2016.01) |
| *F21K 9/68* | (2016.01) |
| *F21V 7/09* | (2006.01) |
| *F21Y 115/10* | (2016.01) |
| *F21V 9/30* | (2018.01) |

(52) U.S. Cl.
CPC .............. *F21S 8/00* (2013.01); *F21V 5/04* (2013.01); *F21V 7/0066* (2013.01); *F21V 7/0091* (2013.01); *F21V 13/12* (2013.01); *G02B 5/0236* (2013.01); *G02B 5/0278* (2013.01); *G02B 6/0018* (2013.01); *G02B 6/0025* (2013.01); *G02B 6/0031* (2013.01); *G02B 6/0043* (2013.01); *G02B 6/0055* (2013.01); *G02B 6/0085* (2013.01); *G02B 19/0028* (2013.01); *G02B 19/0061* (2013.01); *H01L 33/507* (2013.01); *F21V 7/09* (2013.01); *F21V 9/30* (2018.02); *F21Y 2115/10* (2016.08); *H01L 2933/0091* (2013.01)

(58) Field of Classification Search
CPC .. G02B 6/0085; G02B 5/0236; G02B 5/0278; G02B 19/0028; G02B 19/0061; F21K 9/64; F21K 9/68; F21K 9/00; F21S 8/00; F21V 5/04; F21V 7/0066; F21V 7/0091; F21V 7/09; F21V 9/16; F21V 13/12; H01L 33/507
See application file for complete search history.

(56) References Cited

U.S. PATENT DOCUMENTS

| | | | |
|---|---|---|---|
| 4,240,692 A | 12/1980 | Winston | |
| 4,301,461 A | 11/1981 | Asano | |
| 4,374,749 A | 2/1983 | Cusano et al. | |
| 4,389,118 A | 6/1983 | Yuasa et al. | |
| 4,797,609 A | 1/1989 | Yang | |
| 4,907,044 A | 3/1990 | Schellhorn et al. | |
| 5,001,609 A | 3/1991 | Gardner et al. | |
| 5,055,892 A | 10/1991 | Gardner et al. | |
| 5,268,635 A | 12/1993 | Bortolini et al. | |
| 5,282,088 A | 1/1994 | Davidson | |
| 5,335,152 A | 8/1994 | Winston | |
| 5,424,855 A | 6/1995 | Nakamura et al. | |
| 5,727,108 A | 3/1998 | Hed | |
| 5,856,727 A | 1/1999 | Schroeder et al. | |
| 6,095,655 A | 8/2000 | Bigliati et al. | |
| 6,111,367 A | 8/2000 | Asano et al. | |
| 6,155,699 A | 12/2000 | Miller et al. | |
| 6,236,331 B1 | 5/2001 | Dussureault | |
| 6,479,942 B2 | 11/2002 | Kimura | |
| 6,495,964 B1 | 12/2002 | Muthu et al. | |
| 6,504,301 B1* | 1/2003 | Lowery .............. | F21V 9/00 257/E25.02 |
| 6,527,411 B1 | 3/2003 | Sayers | |
| 6,617,560 B2 | 9/2003 | Forke | |
| 6,642,618 B2 | 11/2003 | Yagi et al. | |
| 6,819,505 B1 | 11/2004 | Cassarly et al. | |
| 7,015,514 B2 | 3/2006 | Baur et al. | |
| 7,091,653 B2 | 8/2006 | Ouderkirk et al. | |
| 7,151,283 B2 | 12/2006 | Reeh et al. | |
| 7,286,296 B2 | 10/2007 | Chaves et al. | |
| 7,306,960 B2 | 12/2007 | Bogner et al. | |
| 7,329,907 B2 | 2/2008 | Pang | |
| 7,329,998 B2 | 2/2008 | Jungwirth | |
| 7,344,902 B2 | 3/2008 | Basin et al. | |
| 7,355,284 B2 | 4/2008 | Negley | |
| 7,482,567 B2* | 1/2009 | Hoelen ................ | G01J 1/04 250/205 |
| 7,514,867 B2 | 4/2009 | Yano et al. | |
| 7,522,802 B2 | 4/2009 | Shiau et al. | |
| 7,828,453 B2 | 11/2010 | Tran et al. | |
| 7,859,190 B2 | 12/2010 | Shi | |
| 7,889,421 B2 | 2/2011 | Narendran et al. | |
| 7,954,989 B2 | 6/2011 | Fan | |
| 8,007,118 B2 | 8/2011 | O'Neill et al. | |
| 8,083,364 B2 | 12/2011 | Allen | |
| 8,147,081 B2 | 4/2012 | Mrakovich | |
| 8,168,998 B2 | 5/2012 | David et al. | |
| 8,314,537 B2 | 11/2012 | Gielen et al. | |
| 8,362,695 B2 | 1/2013 | Aanegola et al. | |
| 8,436,380 B2 | 5/2013 | Aanegola et al. | |
| 8,672,523 B2* | 3/2014 | Hikmet .............. | C09K 11/7731 313/110 |
| 2003/0117087 A1 | 6/2003 | Barth et al. | |
| 2003/0235050 A1 | 12/2003 | West et al. | |
| 2004/0052076 A1 | 3/2004 | Mueller et al. | |
| 2004/0150991 A1 | 8/2004 | Ouderkirk et al. | |
| 2005/0023545 A1 | 2/2005 | Camras et al. | |
| 2005/0075234 A1 | 4/2005 | Wolff et al. | |
| 2005/0127833 A1 | 6/2005 | Tieszen | |
| 2005/0185416 A1 | 8/2005 | Lee et al. | |
| 2005/0243570 A1 | 11/2005 | Chaves et al. | |
| 2005/0269582 A1 | 12/2005 | Mueller et al. | |
| 2006/0002108 A1 | 1/2006 | Ouderkirk | |
| 2006/0152140 A1 | 7/2006 | Brandes | |
| 2006/0152931 A1 | 7/2006 | Holman | |
| 2006/0255353 A1 | 11/2006 | Taskar et al. | |
| 2007/0018102 A1 | 1/2007 | Braune et al. | |
| 2007/0256453 A1 | 11/2007 | Barnes et al. | |
| 2007/0257267 A1 | 11/2007 | Leatherdale et al. | |
| 2007/0273282 A1 | 11/2007 | Radkov et al. | |
| 2008/0054280 A1 | 3/2008 | Reginelli et al. | |
| 2008/0079910 A1 | 4/2008 | Rutherford et al. | |
| 2008/0080166 A1 | 4/2008 | Duong et al. | |
| 2008/0101754 A1 | 5/2008 | Parker et al. | |
| 2008/0112183 A1 | 5/2008 | Negley | |
| 2008/0232135 A1 | 9/2008 | Kinder | |
| 2008/0297027 A1 | 12/2008 | Miller et al. | |
| 2009/0200939 A1 | 8/2009 | Lenk et al. | |
| 2009/0201677 A1 | 8/2009 | Hoelen et al. | |
| 2009/0272996 A1 | 11/2009 | Chakraborty | |
| 2009/0310352 A1 | 12/2009 | Chang | |
| 2010/0066236 A1 | 3/2010 | Xu et al. | |
| 2010/0073927 A1 | 3/2010 | Lewin et al. | |
| 2010/0097821 A1 | 4/2010 | Huang et al. | |
| 2010/0123386 A1 | 5/2010 | Chen | |
| 2010/0134016 A1 | 6/2010 | York et al. | |
| 2010/0148151 A1 | 6/2010 | Camras et al. | |
| 2010/0172120 A1 | 7/2010 | Wegh et al. | |
| 2010/0232134 A1 | 9/2010 | Tran | |
| 2010/0263723 A1* | 10/2010 | Allen .................. | C09K 11/02 136/259 |
| 2010/0264432 A1 | 10/2010 | Liu et al. | |
| 2010/0290226 A1 | 11/2010 | Harbers et al. | |
| 2010/0301367 A1 | 12/2010 | Nakamura et al. | |
| 2010/0308354 A1 | 12/2010 | David et al. | |
| 2011/0080108 A1 | 4/2011 | Chiang et al. | |
| 2011/0085112 A1 | 4/2011 | Inditsky | |
| 2011/0089817 A1 | 4/2011 | Lyons et al. | |
| 2011/0176091 A1 | 7/2011 | Boonekamp et al. | |
| 2011/0182065 A1 | 7/2011 | Negley et al. | |
| 2011/0227037 A1 | 9/2011 | Su | |
| 2011/0267800 A1 | 11/2011 | Tong et al. | |
| 2011/0267801 A1 | 11/2011 | Tong et al. | |
| 2011/0273882 A1 | 11/2011 | Pickard | |
| 2011/0291130 A1 | 12/2011 | Diana et al. | |

(56) References Cited

U.S. PATENT DOCUMENTS

| | | |
|---|---|---|
| 2011/0298371 A1 | 12/2011 | Brandes et al. |
| 2012/0033403 A1 | 2/2012 | Lamvik et al. |
| 2012/0039073 A1 | 2/2012 | Tong |
| 2012/0068205 A1 | 3/2012 | Galvez et al. |
| 2012/0112661 A1 | 5/2012 | Van de Ven et al. |
| 2012/0119221 A1 | 5/2012 | Negley |
| 2012/0127694 A1 | 5/2012 | Richardson |
| 2012/0140436 A1 | 6/2012 | Yang et al. |
| 2012/0147296 A1 | 6/2012 | Montgomery et al. |
| 2012/0181565 A1 | 7/2012 | David et al. |
| 2012/0187441 A1 | 7/2012 | Li |
| 2012/0327656 A1 | 12/2012 | Ramer et al. |
| 2013/0021776 A1 | 1/2013 | Veerasamy et al. |
| 2013/0201715 A1 | 8/2013 | Dau et al. |
| 2014/0146541 A1 | 5/2014 | Uebbing |
| 2014/0333198 A1 | 11/2014 | Allen et al. |
| 2014/0334126 A1 | 11/2014 | Speier |
| 2015/0003059 A1 | 1/2015 | Haitz et al. |

FOREIGN PATENT DOCUMENTS

| | | | |
|---|---|---|---|
| CN | 102575830 A | 7/2012 | |
| TW | 200825617 A | 6/2008 | |
| TW | 201021251 A | 6/2010 | |
| WO | WO2001007828 | 2/2001 | |
| WO | WO2001027962 | 4/2001 | |
| WO | WO2003017729 | 2/2003 | |
| WO | WO2004076916 | 9/2004 | |
| WO | WO2007081812 | 7/2007 | |
| WO | WO2009012484 A | 1/2009 | |
| WO | WO 2011160676 A1 * | 12/2011 | ........... A61B 1/0653 |
| WO | WO2012001645 | 1/2012 | |
| WO | WO2013078463 | 5/2013 | |

OTHER PUBLICATIONS

Allen et al., "ELiXIR—Solid-State Luminaire With Enhanced Light Extraction by Internal Reflection," Journal of Display Technology, vol. 3, No. 2, Jun. 2007 pp. 155-159.

Carclo Technical Plastics "LUXEON® I 20 & 26.5mm Range," downloaded from the internet at: http://docs-europe.electrocomponents.com/webdocs/0dcb/0900766b80dcbbeb.pdf on Oct. 30, 2012, 31 pages.

Carr et al., "One-Watt GaAs p-n Junction Infrared Source," Applied Physics Letters, vol. 3, No. 10, Nov. 15, 1963, pp. 173-175.

Carr, "Photometric Figures of Merit for Semiconductor Luminescent Sources Operating in Spontaneous Mode," Infrared Physics, 1966, vol. 6, pp. 1-19.

Intematix, "Design Considerations for ChromaLit™ Ellipse, Candle, and Dome Remote Phosphor Light Sources," Jan. 11, 2012, downloaded from the internet at: http://www.intematix.com/uploads/files/imx-design-considerations-ecd-app-note.pdf, on Oct. 30, 2012, 23 pages.

Intematix, "Mixing Chamber Design Considerations for ChromaLit™ Remote Phosphor Light Sources," Aug. 29, 2012, downloaded from the internet at: http://www.intematix.com/uploads/files/intematix_mixing_chamber_design_for_chromalit.pdf on Oct. 30, 2012, 12 pages.

Liu et al., "Effects of Phosphor's Location on LED Packaging Performance," 2008 International Conference on Electronic Packaging Technology & High Density Packaging (ICEPT-HDP 2008), 7 pages.

Liu et al., "Effects of Phosphor's Thickness and Concentration on Performance of White LEDs," 2008 International Conference on Electronic Packaging Technology & High Density Packaging (ICEPT-HDP 2008), 6 pages.

Mims III, Forrest, "Sun Photometer with Light-Emitting Diodes as Spectrally Selective Detectors," Applied Optics 31, 6965-6967, 1992.

Notification of Transmittal of the International Search Report and the Written Opinion of the International Searching Authority, International App. No. PCT/US2013/059511, dated Feb. 14, 2014, 7 pages.

European Application No. 13836772.7, Supplementary European Search Report dated May 23, 2016, 4 pages.

Chinese Application No. 201380051457.9, Notification of First Office Action, dated Oct. 10, 2016, 10 pages.

\* cited by examiner

LIGHT-EMITTING DEVICE WITH REMOTE SCATTERING ELEMENT AND TOTAL INTERNAL REFLECTION EXTRACTOR ELEMENT

CROSS-REFERENCE TO RELATED APPLICATIONS

This application is a continuation application of and claims priority to U.S. application Ser. No. 14/427,944, filed on Mar. 12, 2015 (now U.S. Pat. No. 9,291,763), which is a U.S. National Stage of International Application No. PCT/US2013/059511, filed Sep. 12, 2013, which claims benefit under 35 U.S.C. § 119(e)(1) of U.S. Provisional Application No. 61/700,724, filed on Sep. 13, 2012, and U.S. Provisional Application No. 61/826,434, filed on May 22, 2013, the entire contents of which are incorporated by reference herein.

The described technology relates to light-emitting devices and luminaires with a remote scattering element and a substantial total internal reflection (TIR) extractor element.

Light-emitting elements (LEEs) are ubiquitous in the modern world, being used in applications ranging from general illumination (e.g., light bulbs) to lighting electronic information displays (e.g., backlights and front-lights for LCDs) to medical devices and therapeutics. Solid state lighting (SSL) devices, which include light-emitting diodes (LEDs), are increasingly being adopted in a variety of fields, promising low power consumption, high luminous efficacy and longevity, particularly in comparison to incandescent and other conventional light sources.

A luminaire is a lighting unit that provides means to hold, position, protect, and/or connect light-emitting elements to an electrical power source, and in some cases to distribute the light emitted by the LEE. One example of a LEE increasingly being used for in luminaires is a so-called "white LED." Conventional white LEDs typically include an LED that emits blue or ultraviolet light and a phosphor or other luminescent material. The device generates white light via down-conversion of blue or UV light from the LED (referred to as "pump light") by the phosphor. Such devices are also referred to as phosphor-based LEDs (PLEDs). Although subject to losses due to light-conversion, various aspects of PLEDs promise reduced complexity, better cost efficiency and durability of PLED-based luminaires in comparison to other types of luminaires.

While new types of phosphors are being actively investigated and developed, configuration of PLED-based light-emitting devices, however, provides further challenges due to the properties of available luminescent materials. Challenges include light-energy losses from photon conversion, phosphor self-heating from Stokes loss, dependence of photon conversion properties on operating temperature, degradation from changes of the chemical and physical composition of phosphors as an effect of overheating, exposure to humidity or other damage, dependence of the conversion properties on intensity of light, propagation of light in undesired directions due to the random emission of converted light that is emitted from the phosphor, undesired chemical properties of phosphors, and controlled deposition of phosphors in light-emitting devices, for example.

SUMMARY

The described technology relates to light-emitting devices and luminaires with a remote scattering element and a substantial total internal reflection (TIR) extractor element.

In one aspect, a light-emitting device includes a light-emitting diode (LED) configured to emit pump light during operation; a phosphor element having a first surface facing the LED, the phosphor element being spaced apart from the LED and positioned to receive at least some pump light from the LED and to emit scattered light; and an extractor including a transparent material, the extractor having an exit surface and a side surface and being arranged to receive a portion of the scattered light through a region adjacent to the phosphor element and to output the scattered light through the exit surface, the side surface being arranged between the region of adjacency and the exit surface, wherein a medium having a refractive index $n_0$ is disposed adjacent the first surface of the phosphor element and the phosphor element has a refractive index $n_1$, where $n_0 < n_1$, and the transparent material has a refractive index $n_2$, where $n_0 < n_2$, and the side surface includes a TIR surface, where the TIR surface is positioned and shaped such that an angle of incidence on the TIR surface of the scattered light received through the region of adjacency that directly impinges on the TIR surface is incident on the TIR surface at an angle of incidence that is equal to or larger than a critical angle for total internal reflection.

The foregoing and other embodiments can each optionally include one or more of the following features, alone or in combination. In some embodiments, the phosphor element can be configured to inelastically scatter at least some of the pump light and to elastically scatter at least some of the pump light. In some embodiments, the TIR surface can extend to the exit surface. In some embodiments, the TIR surface can extend to the region of adjacency. The phosphor element can be planar or a shell. The shell can be convex with respect to the exit surface.

In some embodiments, the light-emitting device can further include a reflective layer on a portion of the side surface. In some embodiments, the light-emitting device can further include a reflective element spaced apart from and extending along at least a portion of the side surface, the reflecting element configured to redirect a portion of light escaping from the side surface back into the extractor. The phosphor element can be at least partially recessed in the extractor. In some embodiments, the exit surface can be non-planar. In some embodiments, the exit surface can include multiple differently shaped portions.

In some embodiments, the exit surface can be positioned and shaped such that an angle of incidence on the exit surface of the scattered light passing through the region of adjacency that directly impinges on the exit surface is less than a critical angle for total internal reflection. In some embodiments, the exit surface can be positioned and shaped such that an angle of incidence on the exit surface of the scattered light passing through the region of adjacency, that directly impinges on the exit surface or impinges on the exit surface after TIR off the TIR surface, is less than a critical angle for total internal reflection. In some embodiments, $n_1$ can be less or equal to $n_2$. The phosphor element can include inelastic and elastic scattering centers. The scattered light can be isotropically scattered light.

In some embodiments, the light-emitting device can further include a secondary reflector adjacent the extractor, where the secondary reflector can be configured to redirect light that is output from the extractor. The secondary reflector can have an input aperture that is disposed proximate the exit surface.

In another aspect, a luminaire, includes a housing and a light-emitting device supported by the housing that includes a light-emitting diode (LED) configured to emit pump light during operation; a phosphor element having a first surface facing the LED, where the phosphor element is spaced apart from the LED and positioned to receive at least some pump light from the LED and to emit scattered light; and an extractor including a transparent material, where the extractor has an exit surface and a side surface and is arranged to receive a portion of the scattered light through a region adjacent to the phosphor element and to output the scattered light through the exit surface, where the side surface is arranged between the region of adjacency and the exit surface, where a medium that has a refractive index $n_0$ is disposed adjacent the first surface of the phosphor element and the phosphor element has a refractive index $n_1$, where $n_0$ is less than $n_1$, and the transparent material has a refractive index $n_2$, where $n_0$ less than $n_2$, and where the side surface comprises a TIR surface, the TIR surface being positioned and shaped such that an angle of incidence on the TIR surface of the scattered light received through the region of adjacency that directly impinges on the TIR surface is incident on the TIR surface at an angle of incidence that is equal to or larger than a critical angle for total internal reflection.

The foregoing and other embodiments can each optionally include one or more of the following features, alone or in combination. In some embodiments, the luminaire can further include an optical element supported by the housing and configured to receive light from the light-emitting device, where the light emitted from the light-emitting device can be further directed and shaped by the optical element. The optical element can be a reflector, a lens, or other optical element.

In another aspect, a light-emitting device includes a light-emitting element (LEE); a scattering element that has a first surface facing the LEE, where the scattering element is spaced apart from the LEE and positioned to receive at least some light from the LEE, and configured to emit scattered light; and an extractor that has a side surface being arranged to receive a portion of the scattered light through a region of adjacency with the scattering element, where the extractor is configured to emit light through an exit surface, where the exit surface is arranged distal the region of adjacency with the scattering element, and where a medium that has a refractive index $n_0$ is disposed adjacent the first surface of the scattering element and the scattering element has a refractive index $n_1$, where $n_0$ is less than $n_1$, and the extractor has a refractive index $n_2$, where $n_0$ is less than $n_2$, and where the side surface is positioned and shaped such that an angle of incidence on the side surface of scattered light received through the region of adjacency that directly impinges on the side surface is equal to or larger than a critical angle for total internal reflection.

The foregoing and other embodiments can each optionally include one or more of the following features, alone or in combination. In some embodiments the scattering element can be shaped as a hemisphere. In some embodiments, the extractor can further include a light guide, where the light guide can extend to the side surface and include the exit surface.

The foregoing and other embodiments can each optionally include one or more of the following features, alone or in combination. In some embodiments, the optical element can be a reflector. In some embodiments, the optical element can be a lens.

BRIEF DESCRIPTION OF THE DRAWINGS

Like elements in different figures are identified with the same reference numeral.

DETAILED DESCRIPTION

Figure 1A:
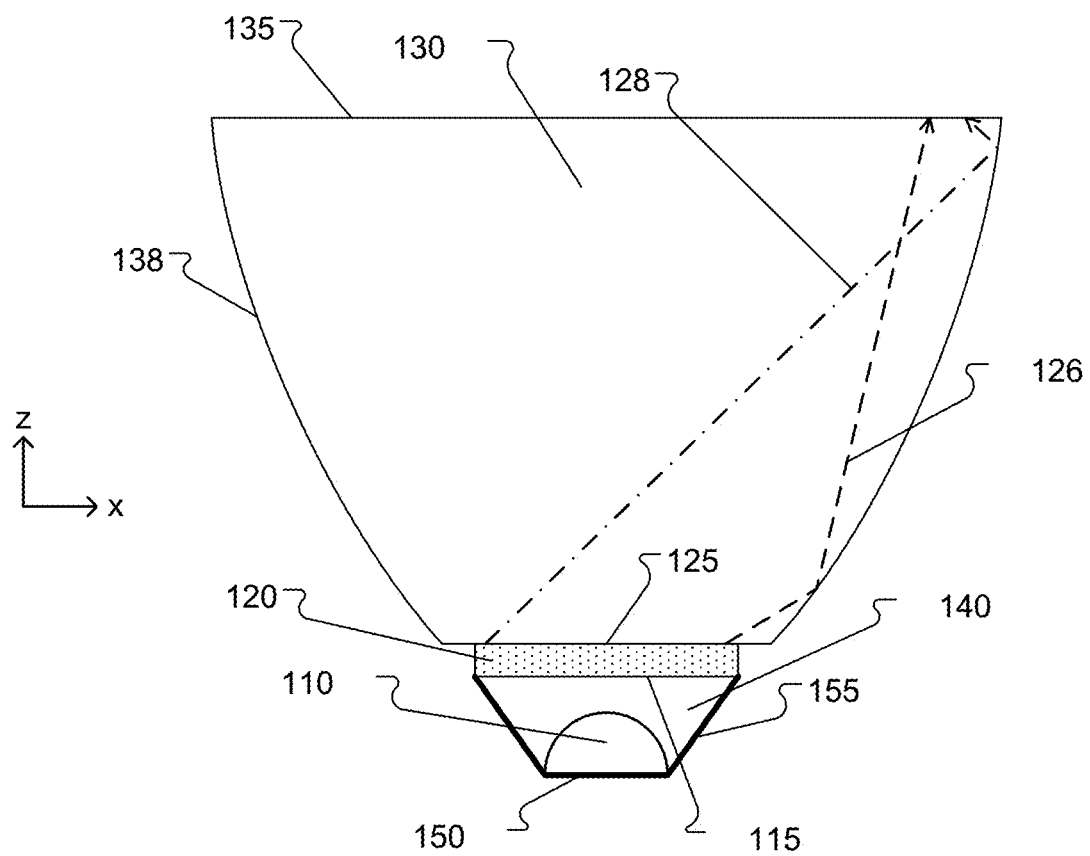
FIGS. 1A-1C show sectional views of embodiments of light-emitting devices with total internal reflection extractor elements.

FIG. 1A shows a cross-sectional side view of an example of a light-emitting device 100 with a total internal reflection (TIR) extractor element 130. The light-emitting device 100 includes a base substrate 150, a light-emitting element 110 (e.g., a blue pump light-emitting diode (LED)), a scattering element 120 (e.g., a phosphor element), along with extractor element 130. The scattering element 120 has an input surface 115 spaced apart from the light-emitting element 110 and positioned to receive light emitted from the light-emitting element 110. The light-emitting-element 110 is disposed on the base substrate 150 in an opening that is, at least in part, defined by the input surface 115. Depending on the embodiment, the light-emitting device 100 can have a general conical, toroidal, elongate or other shape. Such a shape can be symmetrical or asymmetrical with respect to a plane or axis. For example, the light-emitting device 100 can have a continuous or discrete rotational symmetry about an optical axis. Such an optical axis can intersect or can be outside the light-emitting device 100.

In general, the base substrate 150 supports light-emitting element 110 relative to the input surface 115. In light-emitting device 100, the base substrate 150 has a recess in which the light-emitting element 110 is placed and side surfaces 155. The side surfaces 155 can be reflective (e.g., a mirror or a highly-reflective diffusely scattering surface) and at least a portion of the light emitted by the light-emitting element 110 is reflected towards the scattering element 120 by the side surfaces 155. The scattering element 120 and the base substrate 150 together enclose the light-emitting element 110 and form an enclosure 140. Light-emitting element 110 is shown having a domed package for efficient light extraction. While light-emitting element 110 is shown as a single element in the Figures herein, it is apparent to those skilled in the art that the light-emitting element 110 can include multiple emitters, such as an array of emitters in a single package, or an array of light-emitting elements all disposed on base substrate within enclosure 140.

The scattering element 120 in the embodiment shown in FIG. 1A is substantially planar and the recess of the base substrate is shaped such that the light-emitting element 110 is spaced apart from the scattering element 120. In embodiments where the scattering element includes a phosphor, such scattering elements may be referred to as a "remote phosphor." The enclosure 140 is filled with a medium (e.g., a gas, such as air or an inert gas). The scattering element 120 is coupled to the extractor element 130 to form an optical interface 125 including or defined by a region of contact between the scattering element 120 and the extractor element 130, through which the extractor element 130 receives light that is output by the scattering element 120. The optical interface 125 is opposite the input surface 115 of the scattering element 120. The scattering element 120 has substantially uniform thickness, such that a distance between the optical interface 125 and the input surface 115 of the scattering element 120 is approximately constant across the optical interface 125.

The scattering element 120 includes elastic scattering centers, inelastic scattering centers, or both elastic and inelastic scattering centers. The inelastic scattering centers convert at least some of the light received from the light-emitting element 110 (e.g., pump light) to longer-wavelength light. For example, the light-emitting element 110 can emit blue light and the scattering element 120 can include inelastic scattering centers (e.g., a phosphor) that convert blue light to yellow light. The elastic scattering centers isotropically scatter at least some of the light received from the light-emitting element 110 without changing the wavelength of the light. In other words, the elastic scattering centers randomize the directionality of propagation of incident light without changing its wavelength. These scattering centers scatter both, light from the light-emitting element 110 and light that is inelastically scattered from other scattering centers. The result is light that is directionally substantially isotropic and spectrally a mix of light from the light-emitting element 110 and longer-wavelength inelastically scattered light. This mixed light is received by the extractor element 130 through the optical interface 125.

Examples of scattering elements include light-converting material that is also referred to as photoluminescent or color-converting material, for example. Light-converting materials can include photoluminescent substances, fluorescent substances, phosphors, quantum dots, semiconductor-based optical converters, or the like. Light-converting materials also can include rare earth elements. Light-converting materials may be composed of solid particles or fluorescent molecules (e.g. organic dyes) that may be dispersed or dissolved in scattering element 120. Scattering element 120 can include a mixture of light-converting materials having different properties, for example, converting pump light to light having different ranges of wavelengths, or a mixture of elastic scattering centers and inelastic scattering centers including light-converting material. For example, inelastic scattering fluorescent dye molecules may be dissolved in the base material of the scattering element 120 together with solid elastic scattering particles having a different refractive index from the base material of scattering element 120.

The scattering element 120 can be formed either as a separate piece from extractor element 130, or it can be integrally formed as a region within extractor element 130. For example, scattering element 120 can be formed either as a piece of transparent material with scattering centers dispersed within and throughout its bulk, or as a clear substrate with scattering centers deposited on one or both of its surfaces. In some embodiments, the scattering element 120 can be a clear substrate with scattering centers deposited on the input surface 115, or with scattering centers deposited on the opposite surface from the input surface 115, i.e. the surface that is adjacent to the optical interface 125, or on both of these surfaces. In some embodiments, a scattering element can be formed by dispersing scattering centers into a thin region of an extractor element near the light-emitting element 110, or by overmolding an extractor element onto a scattering element to form a scattering element integrated as a single piece with an extractor element.

In certain embodiments, it is desirable to minimize optical reflection losses for light originating in scattering element 120 and entering into extractor element 130, as will be discussed in more detail later. If scattering element 120 is formed as a separate piece from extractor element 130, then scattering element 120 can be placed into optical contact with extractor element 130 during the assembly of light-emitting device 100, e.g. using pressure, or the two pieces 120 and 130 may be connected via immersion such as a layer of transparent optical adhesive along the optical interface 125, or the scattering element 120 and the extractor element 130 may be integrally formed, for example. Effects that may occur if the refractive index of scattering element 120 is close to the refractive index of the extractor element 130 are discussed herein. As such, the refractive index of the scattering element 120 may refer to the refractive index of one or more compounds or an average refractive index thereof. Depending on the embodiment, compounds of the scattering element may include one or more host materials, scattering elements embedded therein and/or other compounds.

The extractor element 130 is formed from a transparent material, such as a transparent glass or a transparent organic polymer (e.g., silicone, polycarbonate or an acrylate polymer). The extractor element 130 has one or more side surfaces 138 and an exit surface 135. The side surfaces 138 are positioned and shaped such that an angle of incidence on the side surfaces 138 of the light that is output by the scattering element 120 and directly impinges on the side surfaces 138 is equal to or larger than a critical angle for total internal reflection. Thus, the side surfaces 138 are configured to provide total internal reflection (TIR) and reflect substantially all the light impinging on the side surfaces 138 towards the exit surface 135. For example, rays 126 and 128 are output by the scattering element 120 and are redirected by the side surfaces 138 via TIR towards the exit surface 135. The exit surface 135 is a transparent surface through which the light received by the extractor element 130 is output. Note that while the side surfaces 138 are shown in FIG. 1A extending to share a common corner or edge with exit surface 135, other configurations are possible, for example, an extractor element can have integrated mounting or locating features or surfaces affecting a small fraction of the light rays. Similarly, while the side surfaces 138 are shown ending at a flat extension of the optical interface 125, the lower corners or edges of the side surfaces may terminate immediately adjacent the outer edge of a scattering element.

Figure 1B:
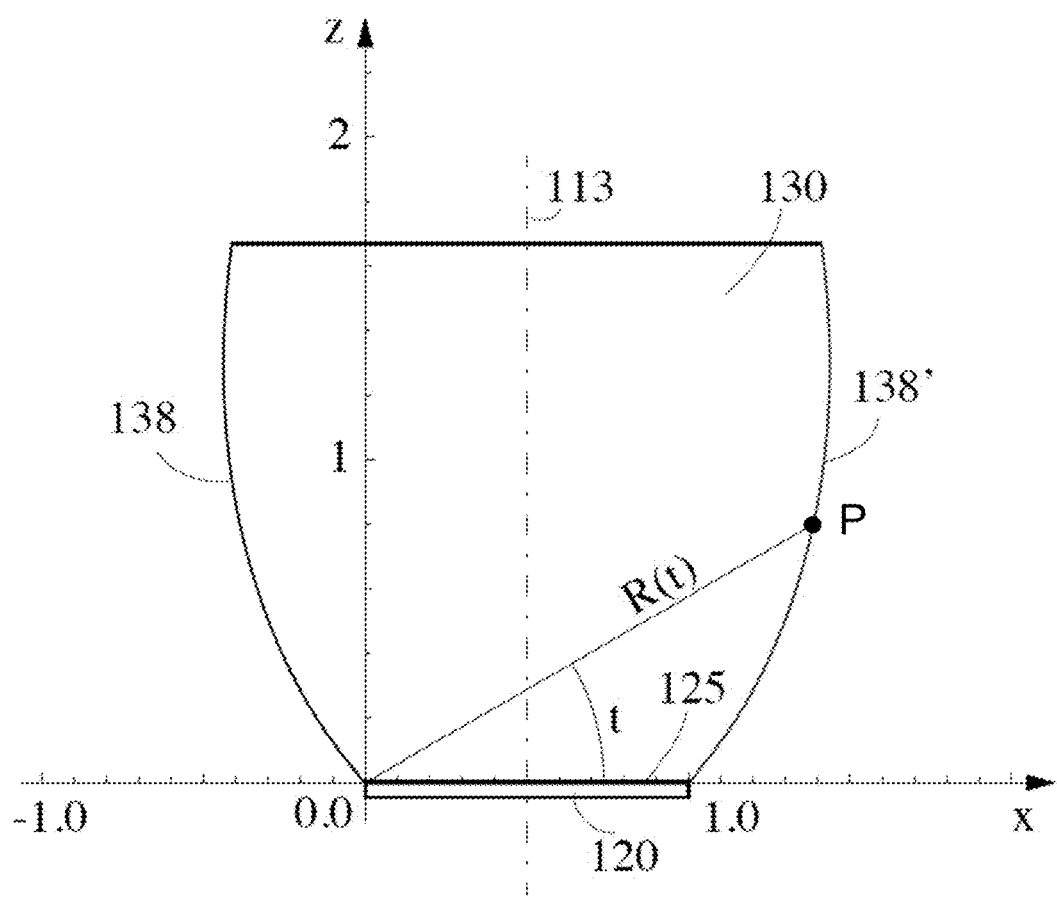

FIG. 1B illustrates a sectional view of a light-emitting device with a flat optical interface 125 in which the width of the scattering element at the optical interface 125 is substantially the same as the width of the base of the extractor. The sectional profile of the side surface 138' that provides a compact, narrow extractor element 130 follows the equation (Eq. 1): $R(t)=Exp(t*Tan(g))$ assuming the optical interface 125 is one unit wide. Here $R(t)$ is the distance from the origin of the coordinate system of points P on the side surface 138' at angles t relative to the x-axis. For a compact extractor that ensures TIR for all rays originating at a flat optical interface, g is equal to the critical angle for total internal reflection $t\_crit$ given by $t\_crit=Arcsin(n\ ambient/n\ extractor\ element)$. Generally, Eq. 1 describes a curve known as an equiangular spiral (also called a logarithmic spiral), which is a compact shape that can effectuate the TIR condition.

In order to provide TIR for all rays emanating directly from the flat optical interface 125, g is greater than or equal to the critical angle. The extractor can be shaped based on a parameter g that is larger than the critical angle, for example, if manufacturing tolerances need to be compensated for to maintain TIR at the side surface. If the ambient medium has a refractive index n ambient of substantially 1, R(t) of a compact extractor can be expressed as R(t)=Exp(t/Sqrt(n extractor element^2−1)), where n extractor element is the refractive index of the optical extractor 130.

Depending on the embodiment and as illustrated in FIG. 1A, the extractor element 130 at the optical interface 125 can be wider than the scattering element 120. If the base of the optical interface 125 is wider than the scattering element 120, the shape of the side surface may follow the above noted equation, may be dilated in z-direction while maintaining the critical angle condition for TIR reflection, or have another shape, for example. Furthermore, the height of the extractor element 130 is generally determined by the maximum angle (t_max) providing a corresponding radius R(t_max) according to Eq. 1 above, but may be limited by other aspects of the system such as angular spread of rays of light reflected from the side surfaces, cross talk between different points of the side surface, or other aspects, for example. It is noted, that an extractor element can have two or more side surfaces of different or equal shape.

Depending on the embodiment, control of an angular spread of rays may be provided if the side surface is shaped in a particular manner. For example, one or more portions of the side surface may be shaped to ensure that rays that are reflected from the side surface remain within a defined range of exit angles. Such a shape can be defined using the following equation (Eq. 2): R(t)=k/(1−Cos [d−t]) for t>d+2g−Pi, which ensures that the exit angle of reflected rays does not exceed the angle parameter d. All angles including the exit angle are measured relative to the x-axis. Still referring to FIG. 1B, at a given point P on the side surface, the reflected ray that results from a ray originating at the optical interface at the origin of the coordinate system x=z=0 has the largest exit angle. Reflected rays from the same point P that result from other rays originating from other points along the optical interface have smaller exit angles. The parameter k can be adjusted to continuously transition the shape of a side surface between Eq. 1 and Eq. 2, for example. It is noted that TIR may not occur for light from a flat optical interface that impinges on a side surface according to Eq. 2 for angles t that do not meet the condition t>d+2g−Pi noted for Eq. 2 above.

Figure 1C:
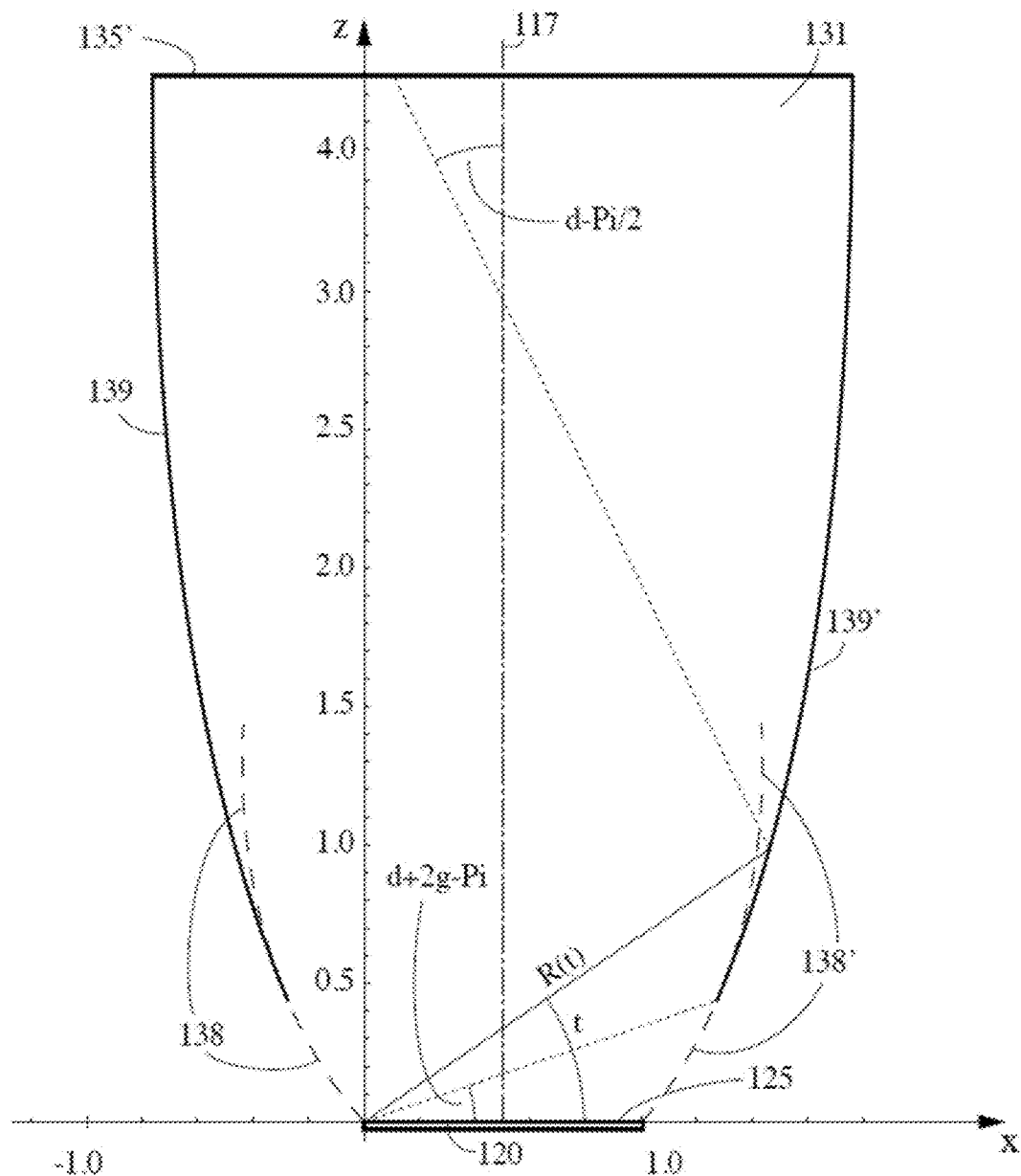

FIG. 1C illustrates a section of an example extractor element 131 in which portions of the side surfaces 139 and 139' are shaped according to Eq. 2. The portions of the side surface 138 and 138' at angles t<d+2g−Pi are shaped according to Eq. 1 to ensure TIR. The side surface may be continuously rotationally symmetric about axis 117 or have translational symmetry along an axis perpendicular to the sectional plane of FIG. 1C. The extractor element 131 at the optical interface 125 has the same width/diameter as the scattering element 120. If the base of the optical interface 125 is wider than the scattering element 120, the shape of the side surface may follow the above noted equation, may be dilated in z-direction while maintaining the critical angle condition for TIR reflection, or have another shape, for example. Furthermore, the length of the extractor element 131 in z-direction may be determined such that an angular spread of rays of light that directly impinges on the exit surface 135' may be limited to an angular range of +/−(d−Pi/2) or according to other considerations, for example.

Depending on the embodiment, side surfaces can have other shapes than the ones noted in the equations above. For example, a side surface can be defined by a truncated cone shaped extractor element with suitably large opening angle and substantially follow an inclined straight section. Other shapes are possible for the side surface that can also ensure the incidence angle of incoming rays from the optical interface 125 at the side surface relative to a surface normal of the side surface at the point of incidence is larger than the critical angle for TIR. Consequently, such extractor elements can widen faster with increasing distance from the optical interface 125 than the one illustrated in FIG. 1A. Not all possible extractor elements that are wider, however, necessarily need to provide a side surface that can provide TIR for all direct rays from the optical interface. Depending on the embodiment, a side surface can comprise portions that are shaped to provide different beam-shaping functions and as such may be defined by different equations that may still maintain TIR. Likewise, for those portions of a side surface that are shaped such that they do not ensure TIR, high reflection can be provided by e.g. a reflective coating applied to those portions of the side surface for which TIR is not ensured, but for which high reflection is desired.

With respect to one or more planes of symmetry, the sectional profile of the side surface 138 for a symmetrical, compact, narrow extractor element may be the mirror inverse of the sectional profile of side surface 138' relative to the optical axis 113 of the light-emitting device. Asymmetrical extractor elements do not need to obey this condition. It is noted that depending on the embodiment, the extractor element 130 may have continuous or discrete rotational symmetry about the optical axis 113 or an axis parallel thereto, or it may have translational symmetry along an axis perpendicular to the sectional plane of FIG. 1B. As such, a section of the light-emitting device perpendicular to its optical axis may have a circular, rectangular, or other shape.

Referring to FIG. 1A, in general, light exits exit surface 135 in a range of angles, referred to as the cone of illumination or beam spread, for example. The angular range of this cone depends on, among other things, the shape of side surfaces 138 and exit surface 135. In some embodiments, the angular range (FWHM—full width at half maximum) can be relatively large, e.g., about 55° or more. In other embodiments, the angular range can be small (e.g., about 30° or less). Intermediate angular ranges are also possible (e.g., from about 30° to about 55°). The shape of the side surfaces and/or exit surface can be designed to give a desired cone of illumination using optical design software, such as Zemax or Code V. The cone of illumination can exhibit a sharp cutoff. In other words, the angular range over which the illumination intensity drops from, e.g., 90% of the maximum intensity to, e.g., 10% of the maximum intensity can be small (e.g., about 10° or less, about 8° or less, about 5° or less). Within the cone of illumination, the light can exhibit good uniformity. For example, the intensity and/or spectral composition may vary relatively little across the cone of illumination. The light-emitting device can be configured such that within 80% of a full-width at half-maximum (FWHM) cone with the least variations, intensity variations are limited to less than 20%, for example.

The enclosure 140 is arranged and configured to recover at least a portion of the scattered light that propagates through the input surface 115 into the medium of the enclosure 140. This means that the enclosure 140 redirects at least a portion of the scattered light back towards the scattering element 120 so that at least some of this light exits the scattering element 120 into the extractor element 130. The design of the enclosure 140 can be selected to reduce the amount of scattered light that returns to the light-emitting element 110 (where it can be absorbed). The enclosure 140 can also be configured to direct a large portion of light from the light-emitting element 110 to the scattering element 120.

In general, the medium in the enclosure 140 has a refractive index $n_0$ and the scattering element 120 has a refractive index $n_1$, where $n_0 < n_1$. Note that where scattering element 120 is formed from a composite material, $n_1$ is the effective refractive index of the element. Light from the scattering element 120 that reaches the input surface 115 is referred to as backward light. Because $n_0 < n_1$, the input surface 115 allows only a fraction of the backward light to escape into the low-index medium of the enclosure 140. The greater the difference in refractive indices $n_0$ and $n_1$, the smaller the fraction of backward light that returns to the enclosure 140. Some of the light within the scattering element 120 incident on the input surface 115 at an angle at or greater than the critical angle is subject to total internal reflection, and so none of this light returns to the enclosure 140.

The transparent material of the extractor element 130 has a refractive index $n_2$, where $n_0 < n_2$, for example. This means that the refractive index mismatch between scattering element 120 and enclosure 140 differs from the refractive index mismatch between extractor element 130 and scattering element 120, and the transmission properties of light within scattering element 120 incident at these interfaces differs accordingly. Generally, the refractive index mismatches are selected so that forward transmission of light (i.e., from the scattering element into the extractor element) is greater than backward transmission into the low index medium of the enclosure 140, and the light-emitting device 100 asymmetrically propagates scattered light.

In such a case, depending on the degree of asymmetry between $n_1/n_0$ and $n_2/n_1$ varying ratios of forward to backward light transmission can be provided. It is believed that the maximum asymmetry in forward to backward light transmission is reached if $n_2$ is equal to $n_1$ (no mismatch for forward transmission) and $n_0 << n_1$ (large mismatch for backward transmission). Moreover, better results may be achieved if $n_1 >> 1$ for increasing the chance of TIR at the back surface (small escape cone). Light-emitting devices that feature asymmetric optical interfaces (i.e., different refractive index mismatches) on opposing sides of the scattering element are referred to as asymmetric scattering light valves (ASLV), or ASLV light-emitting devices.

In the device illustrated in FIG. 1A, light propagation asymmetry arises, for example, from the medium in the enclosure 140 (index $n_0$) and the material of the extractor element 130 (index $n_2$) being different. To illustrate the asymmetric propagation by a specific example, if $n_1 = n_2 = 1.5$ and $n_0 = 1.0$ (that is $n_0 < n_1$), a large fraction (e.g., ~75%) of the isotropically distributed photons impinging on the input surface 115 is reflected by total internal reflection (TIR) back into the scattering element 120 and only a smaller fraction (e.g., ~25%) is transmitted backwards into the enclosure 140 from where some may reach the light-emitting element 110. At the optical interface 125, arranging for the condition $n_1$ to be approximately equal to $n_2$ can cause a large fraction of photons reaching the optical interface 125 to transfer into the extractor element 130.

In some embodiments, where $n_1$ is not close to $n_2$, it can be preferable for $n_2$ to be slightly higher than $n_1$, or to make $n_2/n_1 < n_1/n_0$ as much as possible in order to maximize the propagation asymmetry. In some embodiments, the optical interface 125 includes an optical adhesive, where it can be preferred for the refractive index of the optical adhesive to be close to the refractive index of the scattering element 120 or the extractor element 130, and, for example, in between $n_1$ and $n_2$ or slightly higher than the higher of those two indices.

Figure 2:
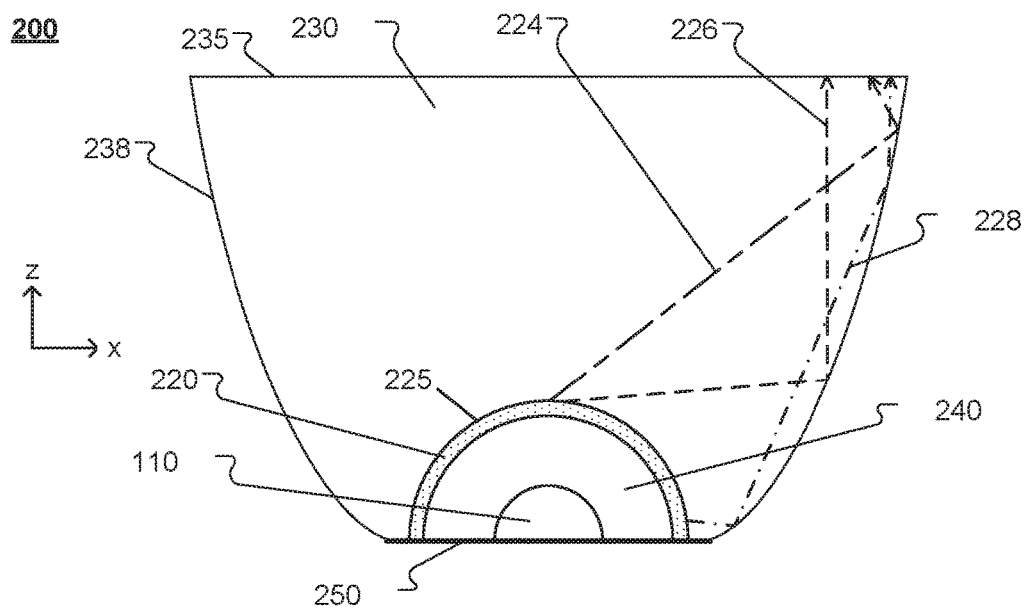
FIGS. 2-3 show sectional views of embodiments of light-emitting devices with non-planar scattering elements.

While the scattering element 120 shown in FIGS. 1A-1C is planar (i.e., it includes co-planar opposing surfaces 115 and 125), other shapes are also possible. For example, non-planar scattering elements, such as curved scattering elements are possible. Referring to FIG. 2, for example, in some embodiments, a light-emitting device 200 includes non-planar scattering element 220 with uniform thickness that is in the form of a meniscus, i.e., having a concave and a convex surface. In device 200, the concave surface of scattering element 220 faces the light-emitting element 110, forming a shell over the light-emitting element. The light-emitting device includes a base substrate 250, the scattering element 220, and an extractor element 230. The light-emitting element 110 is disposed on a surface of the base substrate 250. The base substrate 250 is planar and the surface on which the light-emitting element 110 is disposed can be reflective (e.g., a mirror) to reflect a portion of light emitted by the light-emitting element 110 towards the scattering element 220. The scattering element 220 and at least a portion of the base substrate 250 together enclose the light-emitting element 110 and form an enclosure 240.

The scattering element 220 is spaced apart from the light-emitting element 110, forming the enclosure 240 that may be filled with a low refractive index medium (e.g., a gas, such as air or inert gas). The scattering element 220 is coupled to the extractor element 230 to form an optical interface 225, through which the extractor element 230 receives light that is output by the scattering element 220.

Like extractor element 130 described above, the extractor element 230 has side surfaces 238 and an exit surface 235. The side surfaces 238 are shaped to provide TIR of at least some light impinging on the side surfaces 238 from the scattering element 220. The reflected light may then be redirected towards the exit surface 235. For example, rays 224, 226, and 228 are output by the scattering element 220 and redirected by the side surfaces 238 via TIR towards the exit surface 235. Examples of light-emitting devices with side surfaces that are shaped to reflect substantially all light from a hemi-spherical scattering element via TIR are described further below.

Figure 3:
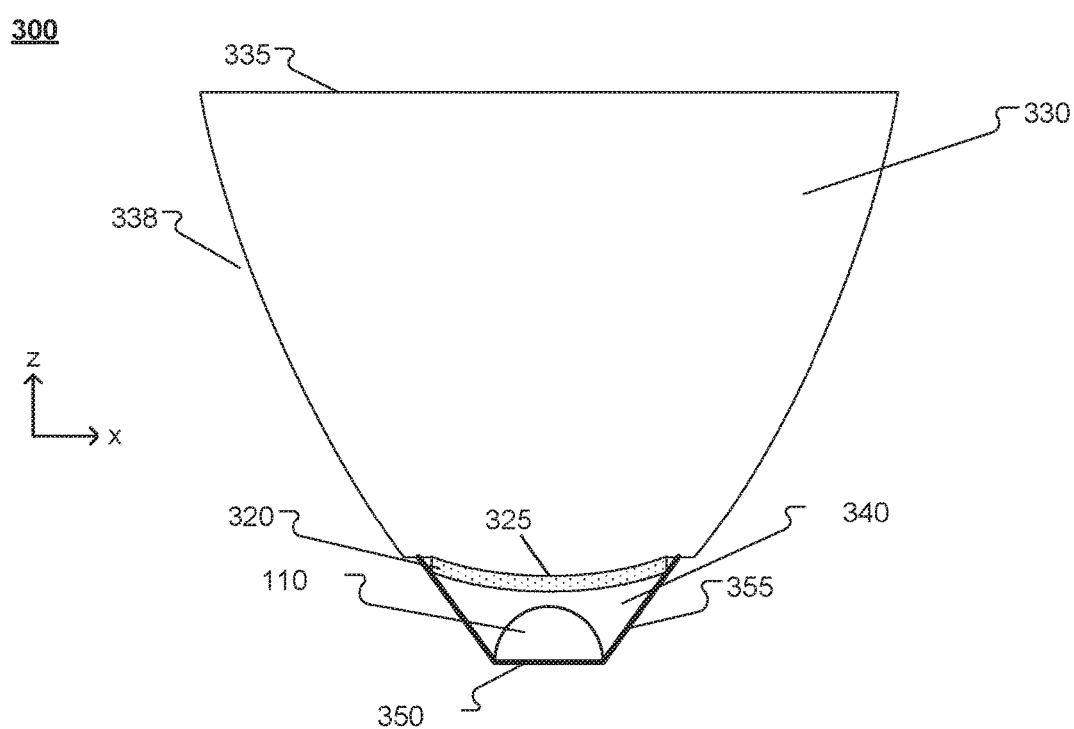

Other configurations of curved, non-planar scattering elements are also possible. For example, FIG. 3 shows a cross-sectional side view of an example of a light-emitting device 300 with a meniscus-shaped scattering element 320, however here the convex surface of the scattering element faces the light-emitting element. Similar to the light-emitting device 200, the light-emitting device 300 includes a base substrate 350, a light-emitting element 110, the scattering element 320, and an extractor element 330. The base substrate 350 has a recess in which the light-emitting element 110 is placed and side surfaces 355. The side surfaces 355 can be reflective (e.g., a mirror) and at least a portion of the light emitted by the light-emitting element 110 is reflected towards the scattering element 320 by the side surfaces 355.

The scattering element 320 is spaced apart from the light-emitting element 110. The scattering element 320 and the base substrate 350 together enclose the light-emitting element and form an enclosure 340. The scattering element 320 is coupled to the extractor element 330 to form an optical interface 325, through which the extractor element 330 receives light that is output by the scattering element 320.

As for the prior embodiments, the extractor element 330 has side surfaces 338 and an exit surface 335. The side surfaces 338 are shaped to provide TIR and reflect substantially all the light impinging on the side surfaces 338 towards the exit surface 335.

Figure 4:
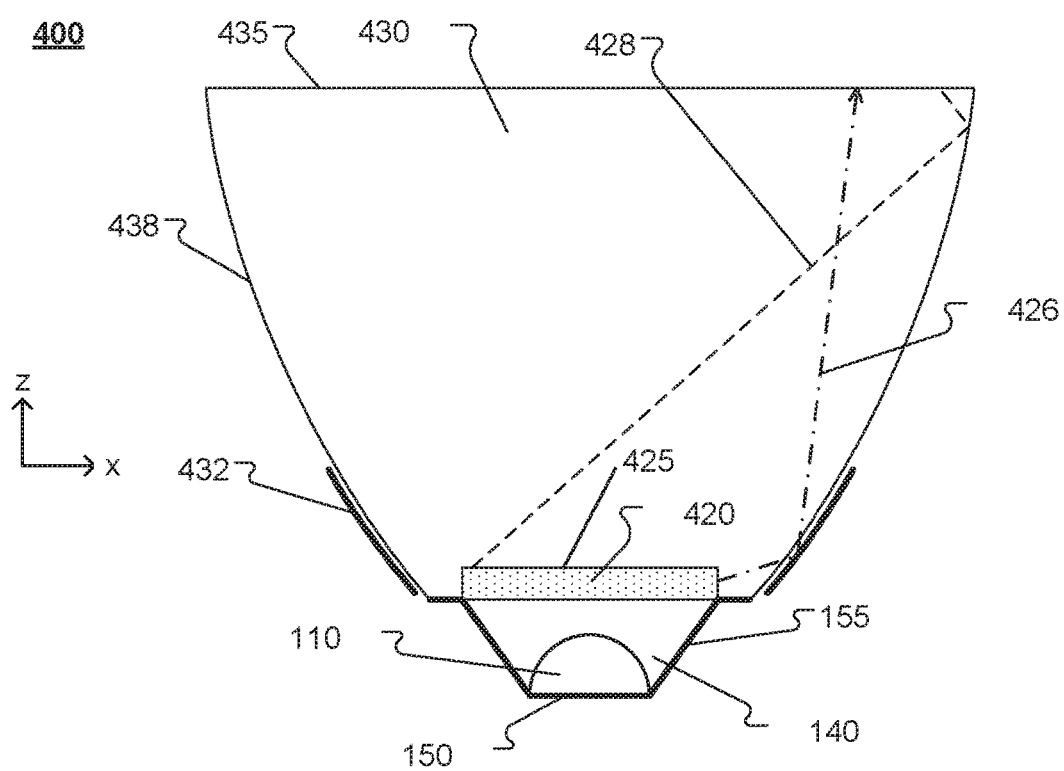
FIG. 4 shows a sectional view of an embodiment of a light-emitting device with an extractor element including a reflective element.

While the side surfaces in the prior embodiments are shaped so that no light is incident on any point of the side surfaces at angles less than the critical angle, other configurations are also possible. For example, in some embodiments, a portion of the side surfaces may receive light from the scattering element at angles less than the critical angle. In such cases, it may be desirable to block light exiting the extractor at the side surfaces so as to avoid unwanted extraneous light emission from the light-emitting device. The blocked light can be absorbed or reflected. It is generally preferable to reflect the light in order to improve the efficiency of the light-emitting device. For example, FIG. 4 shows a cross-sectional side view of an example of a light-emitting device 400 with an extractor element 430 including one or more reflective elements 432. The light-emitting device 400 includes a base substrate 450, a light-emitting element 110, a scattering element 420, and an extractor element 430. The reflective elements 432 are coupled to side surfaces 438 of the extractor element 430 and arranged to reflect some of the light output by the scattering element 420 towards an exit surface 435 of the extractor element 430.

Generally, reflective elements 432 can be implemented at portions of the side surfaces 438 of the extractor element 430 that do not provide TIR to redirect light escaping through the side surfaces back into the extractor element.

For example, rays 426 and 428 are output by the scattering element 420 and redirected towards the exit surface 435 of the extractor element 430. Ray 428 is redirected by the side surface 438 via TIR. Ray 426 impinges on the side surface 438 at an angle that is smaller than the critical angle for TIR, and thus, passes through the side surface 438, but is redirected back into the extractor element by the reflective element 432. Reflective elements 432 can be applied or deposited to the side surfaces 438 as a reflective coating, or they may be held in position by another mechanical structure (not shown).

While the reflective surface in FIG. 4 is located at the lower portion of the side surfaces of the extractor element, the reflective surface can be positioned at any other portion of the side surfaces that does not provide TIR.

In FIG. 4, the scattering element 420 is shown recessed in the extractor element 430. In this case, an optical interface 425 extends along the top surface of the scattering element 420, which may be a disk shape, and down the sides of the disk. Such a configuration may provide high efficiency at capturing emission from the scattering element 420. The configuration of FIG. 4 can be fabricated using optical adhesive to fill the optical interface 425, or monolithically with the extractor element 430.

Figure 5:
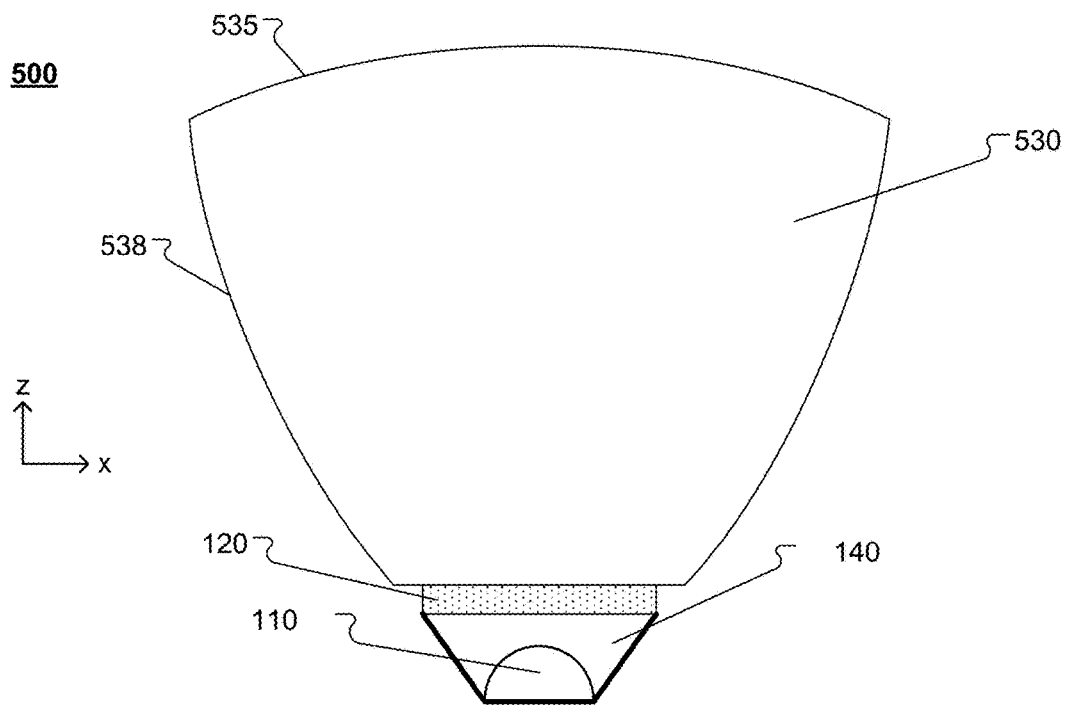
FIGS. 5-6 show sectional views of embodiments of light-emitting devices that include an extractor element having non-planar exit surfaces.

While the exit surface shown in FIGS. 1-4 is planar, other shapes are also possible. For example, all or a portion of the exit surface may be curved. FIG. 5 shows a cross-sectional side view of an example of a light-emitting device 500 including an extractor element 530 with a non-planar exit surface 535. Light output by a scattering element 520 is directed, at least in part, via TIR at side surfaces 538 of the extractor element 530 towards the exit surface 535. The exit surface 535 is a transparent surface configured to output the light received by the scattering element 520.

In some embodiments, the exit surface 535 is positioned and shaped such that an angle of incidence on the exit surface 535 of the mixed light provided by the scattering element 520 that directly impinges on the exit surface 535 is less than the critical angle for total internal reflection, and thus, such light is output through the exit surface 535 without TIR. For example, the exit surface 535 can be configured to output such light into air without TIR and only reflect a small fraction, depending on polarization and incidence angle down to about ~4% or below, via Fresnel reflection.

Anti-reflection coatings can be used on the exit surface 535. Generally, when designing the exit surface 535 and the side surfaces 538, TIR at the exit surface 535 for light incident directly from the scattering element 520 onto the exit surface 535 and light reflected from the side surfaces 538 before impinging on the exit surface 535, should be taken into consideration when optimizing the beam pattern and optical losses of the light-emitting device 500. In some embodiments, the shapes of the side surfaces 538 and the exit surface 535 can be formed such that incident angles are limited to smaller angles than just below the critical angle for TIR (e.g., the Brewster angle), to further reduce Fresnel reflections.

Figure 6:
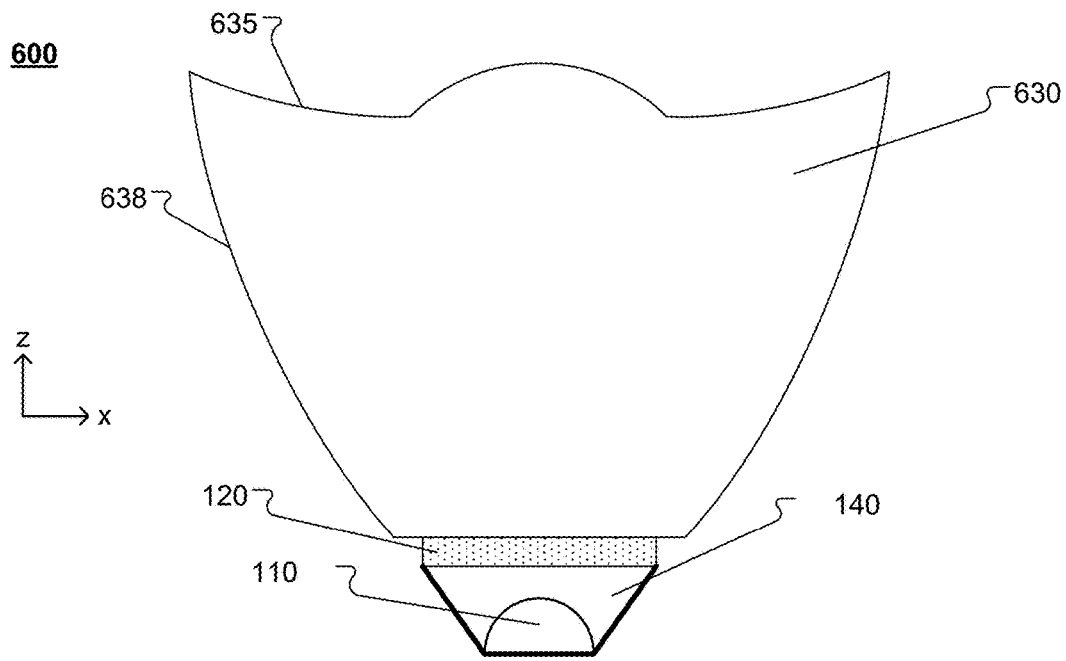

FIG. 6 shows a cross-sectional side view of another example of a light-emitting device 600 including an extractor element 630 with a non-planar exit surface 635. Light output by a scattering element 620 is directed, at least in part, via TIR at side surfaces 638 of the extractor element 630 towards the exit surface 635. The exit surface 635 is a transparent surface and can be shaped to provide a desired illumination pattern. In FIG. 6, the exit surfaced 635 includes multiple differently shaped portions through which the light received by the extractor element 630 is output.

Figure 7:
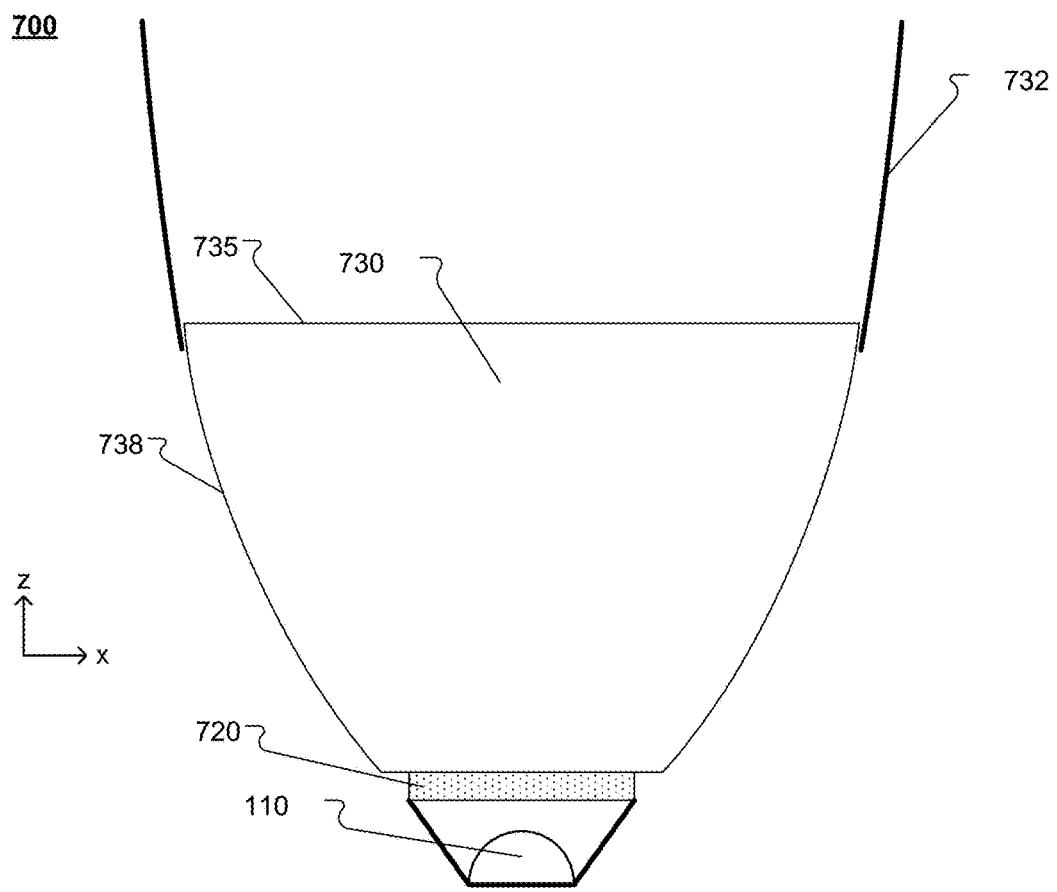
FIG. 7 shows a sectional view of an embodiment of a light-emitting device with a secondary reflector.

FIG. 7 shows a cross-sectional view of a light-emitting device 700 with a secondary reflector 732. Light output by a scattering element 720 is directed, at least in part, via TIR at side surfaces 738 of an extractor element 730 towards an exit surface 735 of the extractor element 730. The exit surface 735 is a transparent surface through which the light received from the scattering element is output. The secondary reflector 732 is arranged and configured to redirect at least some of the light that is output through the exit surface 735. In some embodiments, the secondary reflector 732 is held adjacent to the exit surface 735 of the extractor element 730 by a frame (not shown).

In general, luminaires can be constructed that include a housing to support one or more light-emitting devices. Such a luminaire may provide means for mounting and aiming the one or more light-emitting devices, and may also optionally include means for connecting electrical power to the one or more light-emitting devices. Additional optional optical elements to further direct or shape the light pattern emanating from the one or more light-emitting devices can also be incorporated into a luminaire.

Figure 8A:
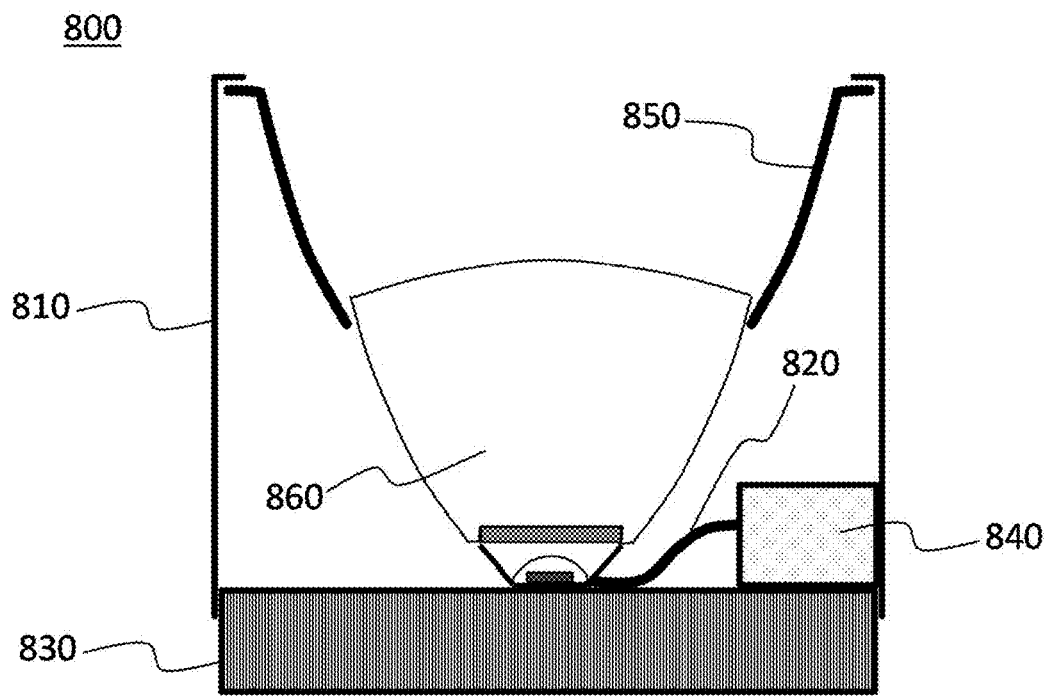
FIGS. 8A-8B show sectional views of embodiments of luminaires including light-emitting devices with secondary optical elements.
Figure 8B:
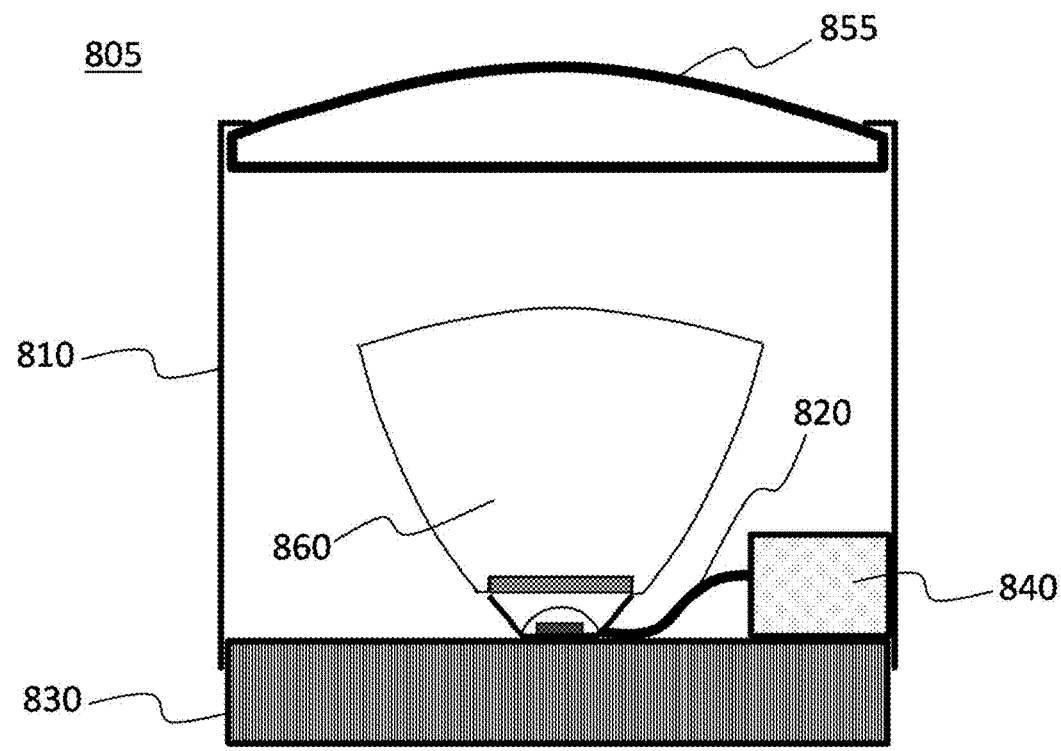

FIGS. 8A and 8B show sectional views of embodiments of luminaires with optional secondary optical elements. The luminaire 800 shown in FIG. 8A includes a light-emitting device 860 (e.g., such as light-emitting devices shown in FIGS. 1-6) and a housing 810 to support and protect the light-emitting device 860. The housing 810 can include structures (not shown) to facilitate mounting of the luminaire 800. The luminaire 800 can provide means for electrical connection of the light-emitting device 860 to a power source outside the luminaire, for example. Electrical connection 820 is shown schematically as a wire, but can include other connection means such as flex circuits, printed circuits, connector contacts, or other electrical connection means known in the art.

In some embodiments, the light-emitting device 860 can be coupled to a cooling device 830 such as a heat sink. The optional cooling device 830 can be used to remove heat from the area of the light-emitting element within the light-emitting device 860. The cooling device 830 can be passive (including, e.g., fins for free convection), or can incorporate active cooling mechanisms such as fans or thermoelectric devices. The luminaire 800 can also include an optional electronic module 840. The electronic module 840 can include additional electronics such as conversion electronics to convert mains power voltages and currents, which can be, for example, line-voltage AC, into voltages and currents of types (e.g., DC) and levels suitable for driving the light-emitting element within light-emitting device 860. Other functions can also be incorporated into the electronics module 840, including, but not limited to, controllers for dimming, communication with controllers outside the luminaire 800, and sensing of ambient characteristics such as light levels, the presence of humans.

The housing 810 of luminaire 800 can also support an additional optical element, such as a reflector 850. The reflector 850 can be used for direction, distribution, or shaping of the light that is output from light-emitting device 860. For example, light emitted at large angles with respect to the axis of the luminaire 800 and light-emitting device 860 can be redirected into a narrower beam pattern in the far field of the luminaire 800 by proper design of the reflector 850.

The luminaire 805 shown in FIG. 8B also includes the light-emitting device 860 and the housing 810 to support and protect the light-emitting device 860. The luminaire 800 further includes a lens 855 as an additional optical element coupled to the housing 810. The lens 855 can be configured to perform additional optical functions, such as diffusing light to achieve a desirable pattern or reduce glare, and can incorporate additional structures to accomplish these functions. Although not illustrated, some embodiments of luminaires can include both reflectors 850 and lenses 855.

The luminaires shown in FIGS. 8A and 8B are exemplary embodiments. Other embodiments can use different configurations of reflectors or lenses, combinations of reflectors and lenses, and/or different relative positions within the luminaire of the light-emitting device with respect to the reflectors or lenses, as is apparent to those skilled in the art. For example, a reflector of a different shape and oriented differently from that shown in FIG. 8A can be used to redirect light along an axis different from an axis of the light-emitting device. In some embodiments, a lens can be, for example, a Fresnel lens, or a system of multiple lenses. Other functions in addition to directing or concentrating the light can be performed by transmissive optical elements such as lenses, or reflective optical elements such as reflectors. For example, lenses or reflectors can have structures incorporated within them or on their surfaces, such as small-scale roughness or microlenses, designed to diffuse or shape the light in the far field. In some embodiments, combinations of reflectors and lenses and/or additional transmissive optical elements can be used.

While reflective surfaces, such as reflective surfaces of the base substrate 250 as shown in FIG. 2 or reflective elements 432 as shown in FIG. 4, can be used to redirect light within the extractor element towards an exit surface, an extractor element can be formed to provide TIR of substantially all the light that impinges on the side surfaces of the extractor element.

Figure 9:
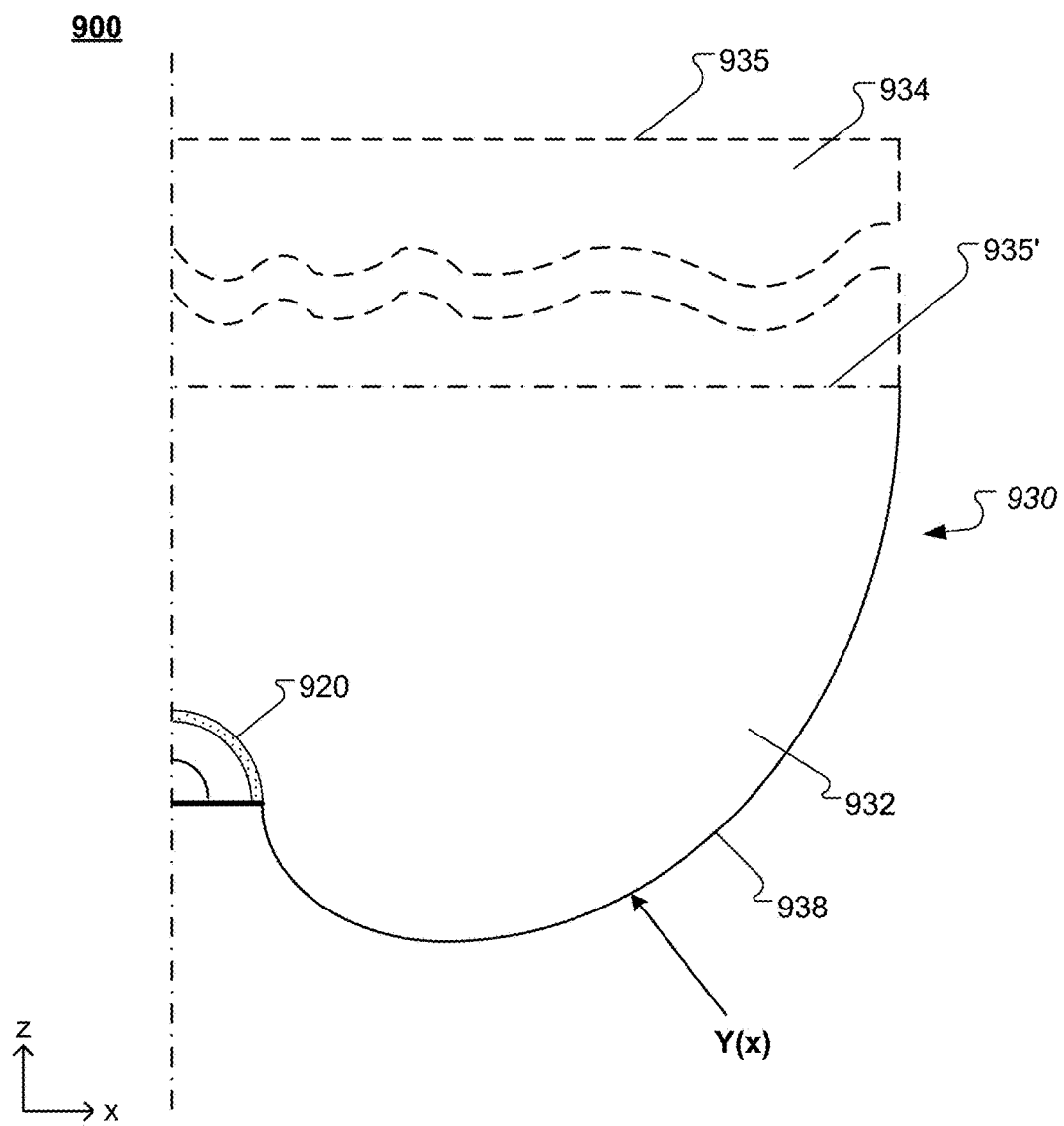
FIG. 9 shows a sectional view of an embodiment of a light-emitting device with a TIR extractor element.

FIG. 9 shows a sectional view of an example light-emitting device 900 with a non-planar scattering element 920. The light-emitting device 900 includes a TIR extractor element 930. The TIR extractor element 930 includes side surfaces 938 that are shaped to provide TIR and reflect substantially all the light impinging on the side surfaces 938 from scattering element 920 towards, depending on the embodiment, a respective exit surface 935' or 935. In some embodiments, the TIR extractor element 930 can include a flux transformation element 932 and a light guide 934. The flux transformation element 932 transforms the light that is output by the scattering element 920 into light with an angular distribution within the TIR angle of the light guide 934. The light guide 934 guides the light received from the flux transformation element 932 via TIR towards the exit surface 935. The concept of an extractor element including a flux transformation element and a light guide generally applies to the embodiment of FIG. 9 and can further apply to other embodiments of the present technology.

Figure 10A:
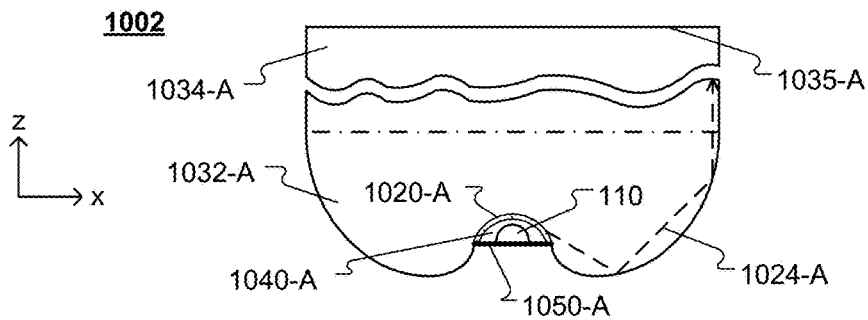
FIGS. 10A-10C show sectional views of various embodiments of light-emitting devices with curved scattering elements.
Figure 10B:
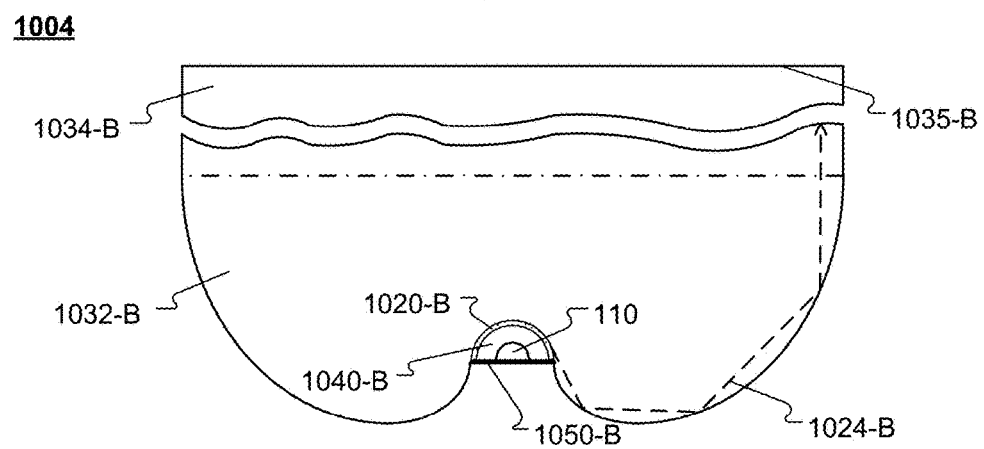
Figure 10C:
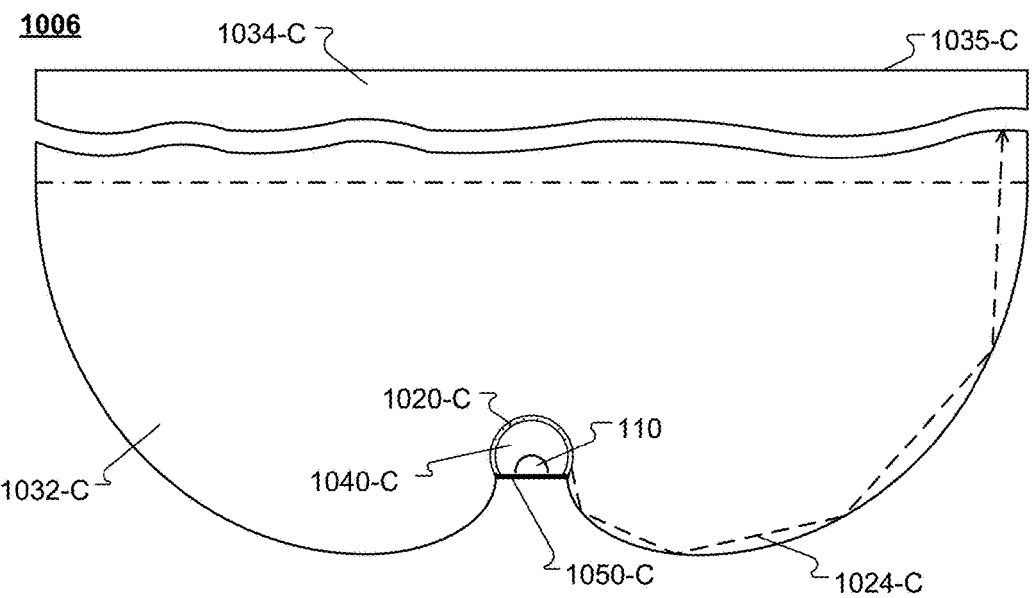

The shape of a TIR side surface of a flux transformation element or an extractor element, respectively, for a scattering element with a circular section can be calculated by applying the following equation (Eq. 3):

$$t = t0 + \text{ArcTan}[1/\text{Sqrt}[-1+R^2]] + \tfrac{1}{2} \text{Cot}[g] * \text{Log}[\text{Sec}[g]^4(R^2-(-2+R^2)\text{Cos}[2g]+2\text{Sqrt}[-1+R^2]\text{Sin}[2g])\text{Tan}[g]^2],$$

which provides the inverse function of R(t) describing the shape of the TIR side surface in the plane of the section in which the scattering element has a circular shape. As such the scattering element can have a spherical, cylindrical or other shape, for example. Here R(t) is the distance of points P on the side surface 938 from the origin of a coordinate system at angles t relative to the x-axis, and g is equal or larger than the critical angle given by Arcsin(n ambient/n extractor element). The origin of the coordinate system is set to coincide with the center of a unit circle or sphere that defines the circular section of a spherical/cylindrical scattering element. R(t) can be scaled to accommodate a spherical scattering element with radii other than one. t0 determines the bottom starting point of the side surface and as such can be adapted to coincide with the bottom edge of spherical scattering elements that have different angular extents as indicated in FIGS. 10A-10C. For example, t0 can be adapted to accommodate spherical scattering elements with an angular extent that is smaller than a hemisphere (similar to FIG. 10A), substantially a hemisphere (similar to FIG. 10B), or larger than a hemisphere (similar to FIG. 10C). It is noted that FIGS. 10A to 10B are intended to illustrate different light-emitting devices with different scattering elements that have a generally curved optical interface including cylindrical shapes, spherical shapes or other shapes. Such light-emitting elements may have scattering elements forming ellipsoidal or otherwise shaped optical interfaces, for example. Such interfaces can be smooth or substantially facetted, for example.

The height of the extractor element 930 may be determined by the maximum angle t_max and a corresponding R(t_max) according to the above noted equation but may be limited by other aspects of the system such as by angular spread of rays of light reflected from the side surfaces, cross talk between different points of the side surface, or other aspects, for example. It is noted, that an extractor element can have side surfaces of different shapes.

Depending on the embodiment, side surfaces can have other shapes than defined in the above noted equation. For example, the side surface can be defined by a truncated cone shaped extractor element with suitably large opening angle and substantially follow an inclined straight section. Other shapes, with rotational, translational or no symmetry, are possible for as long as the side surface ensure the incidence angle of incoming rays from the optical interface at the side surface relative to a surface normal of the side surface at the point of incidence is larger than the critical angle for TIR. Consequently, such extractor elements can widen faster with increasing distance from the optical interface than the one illustrated in FIGS. 9 and 10A-10C. Not all possible extractor elements that are wider, however, necessarily need to provide a side surface that can provide TIR for all direct rays from the optical interface. Depending on the embodiment, a side surface can comprise portions that are shaped to provide different functions and as such may be defined by different equations.

The sectional profile of the side surface 938 for a symmetrical, compact, narrow extractor element is the mirror inverse of the sectional profile of side surface relative to the optical axis of the extractor element. It is noted that depending on the embodiment, the extractor element may have continuous or discrete rotational symmetry about the optical axis or an axis parallel thereto, or it may have translational symmetry along an axis perpendicular to the sectional plane of FIG. 9. As such, a section of the light-emitting device perpendicular to its optical axis may have a circular, rectangular, or other shape.

The shape of a flux transformation element varies dependent on the shape of the scattering element through which the flux transformation element receives the light. For example, the flux transformation element can be an axisymmetric, fully dielectric structure with a hemispherical scattering element. Other embodiments include but are not limited to hyper-hemispherical scattering elements.

FIGS. 10A-10C show examples of TIR light-emitting devices with curved scattering elements (e.g., phosphor structures). In the light-emitting devices 1002, 1004, and 1006, the concave surface of the respective scattering elements 1020-A, 1020-B, and 1020-C faces the light-emitting element 110, forming a shell over the light-emitting element. The light-emitting devices 1002, 1004, and 1006 include base substrates 1050-A, 1050-B, and 1050-C, the scattering elements 1020-A, 1020-B, and 1020-C, flux transformation elements 1032-A, 1032-B, and 1032-C, and optional light guides 1034-A, 1034-B, and 1034-C.

The light-emitting element 110 is disposed on a surface of the respective base substrates 1050-A, 1050-B, and 1050-C. The base substrates 1050-A, 1050-B, and 1050-C are planar and the surface on which the light-emitting element is disposed can be reflective (e.g., a mirror) to reflect a portion of light emitted by the light-emitting element 110 towards the respective scattering elements 1020-A, 1020-B, and 1020-C. The scattering element 1020-A, 1020-B, and 1020-C, and at least a portion of the base substrates 1050-A, 1050-B, and 1050-C together enclose the respective light-emitting elements 110 and form enclosures 1040-A, 1040-B, and 1040-C respectively.

The scattering elements 1020-A, 1020-B, and 1020-C are spaced apart from the respective light-emitting element 110, forming the enclosures 1040-A, 1040-B, and 1040-C that are filled with a low refractive index medium (e.g., a gas, such as air or inert gas). The scattering elements 1020-A, 1020-B, and 1020-C are coupled to the respective flux transformation element 1032-A, 1032-B, and 1032-C to form optical interfaces, through which the flux transformation elements 1032-A, 1032-B, and 1032-C receive light that is output by the respective scattering elements 1020-A, 1020-B, and 1020-C.

The flux transformation elements 1032-A, 1032-B, and 1032-C, and the light guides 1034-A, 1034-B, and 1034-C, if present, have side surfaces that are shaped to provide TIR and reflect substantially all the light impinging on the side surfaces from the respective scattering element 1020-A, 1020-B, and 1020-C towards exit surfaces 1035-A, 1035-B, and 1035-C respectively. For example, rays 1024-A, 1024-B, and 1024-C are output by the scattering elements 1020-A, 1020-B, and 1020-C and redirected by the respective side surfaces via TIR towards the exit surfaces 1035-A, 1035-B, and 1035-C respectively.

FIG. 10A shows a scattering element 1020-A shaped as a spherical section, FIG. 10B shows a scattering element 1020-B shaped as a hemisphere, and FIG. 10C shows a scattering element 1020-C shaped as a hyper-hemisphere. To provide TIR, the side surfaces of the flux transformation element are shaped such that they correspond to the particular shape of the scattering element. For example, as shown in FIGS. 10A-10C, the curvature of TIR side surfaces of a flux transformation element for a scattering element shaped as a spherical section, such as 1020-A, is narrower than the curvature of TIR side surfaces of a flux transformation element for scattering elements shaped as a hemisphere, such as 1020-B, or hyper-hemisphere, such as 1020-C. Other configurations of curved scattering elements, such as ellipsoidal or paraboloidal shapes are also possible.

The concept of an extractor element comprising a flux transformation element and a light guide by design permits the components of the light-emitting element to be separated by function. For example, the flux transformation element can be configured to transform the radiation pattern provided by the scattering element to a radiation pattern that efficiently couples into the light guide. The flux transformation element may also be configured to provide light with a certain flux profile and the light guide may be configured to merely translate or further transform such a flux profile. Depending on the embodiment, the extractor element further may be configured to compensate for dispersion of media included in the extractor element.

In general, the light-emitting elements can be, for example, bare light-emitting diode (LED) dies or encapsulated LED dies, including commercially available LEDs. The light-emitting element 110 is configured to produce and emit light during operation. A spectral power distribution of light emitted by the light-emitting element 110 (also referred to as pump light) can be blue, for instance. The spectral power distribution for visible light is referred to as chromaticity. In general, the light-emitting element 110 is a device that emits radiation in a region or combination of regions of the electromagnetic spectrum for example, the visible region, infrared and/or ultraviolet region, when activated by applying a potential difference across it or passing a current through it, for example. The light-emitting element 110 can have monochromatic, quasi-monochromatic, polychromatic or broadband spectral emission characteristics.

Examples of light-emitting elements that are monochromatic or quasi-monochromatic include semiconductor, organic, polymer/polymeric light-emitting diodes (LEDs). In some embodiments, the light-emitting element 110 can be a single specific device that emits the radiation, for example an LED die, or/and can be a combination of multiple instances of the specific device that emit the radiation together. Such light-emitting device 110 can include a housing or package within which the specific device or devices are placed. As another example, the light-emitting element 110 includes one or more lasers and more (e.g., semiconductor lasers), such as vertical cavity surface emitting lasers (VCSELs) and edge emitting lasers. In embodiment utilizing semiconductor lasers, the scattering element functions to reduce (e.g., eliminate) spatial and temporal coherence of the laser light, which may be advantageous where the light-emitting device may be viewed directly by a person. Further examples of a light-emitting element 110 include superluminescent diodes and other superluminescent devices.

Moreover, while the scattering element is shown in the figures with a constant thickness, the thickness of the scattering element can also vary with position. While the figures only show one light-emitting element, multiple light-emitting elements can also be used. For example, multiple pump light-emitting elements, one or more pump light-emitting elements and one or more chromatic light-emitting elements (e.g., red LEDs), one or more white light-emitting elements and one or more chromatic light-emitting elements, or one or more white light-emitting elements, can be used in the light-emitting device. If white light-emitting elements are used, the light-emitting device can include a scattering element with only elastic scattering centers instead of elastic and inelastic scattering centers.

In general, the light-emitting devices described herein may have a variety of form factors. In some embodiments, they may be formed to fit a standard light socket (e.g., an Edison socket) and/or may be formed to replace a conventional (e.g., incandescent or compact fluorescent) bulb. For example, the light-emitting devices can be formed to replace a PAR-type bulb or an A-type bulb (e.g., an A-19). Each of the described embodiments is shown in cross-section. In general, the light-emitting devices can be rotationally symmetric or non-rotationally symmetric (e.g., extended along an axis out of the plane of the page).

Accordingly, other embodiments are in the following claims.

What is claimed is:

1. A light-emitting device comprising:
    a light-emitting element (LEE);
    a scattering element spaced apart from the LEE, configured to scatter received light and arranged to receive light from the LEE;
    an extractor arranged to form an optical interface with the scattering element through which the extractor receives light, the extractor including a side surface and an exit surface, the extractor being configured to emit light through the exit surface to an ambient environment, wherein
        the side surface is shaped such that an angle of incidence of light received directly from the optical interface is reflected via total internal reflection, and
        the exit surface is non-planar and comprises multiple differently shaped portions; and
    a reflective surface arranged between the optical interface and the side surface of the extractor, the reflective surface being arranged and configured to reflect light from the optical interface back into the extractor.

2. The light-emitting device of claim 1, wherein the scattering element is a shell.

3. The light-emitting device of claim 1, wherein the extractor further comprises a light guide, the light guide extending the side surface and comprising the exit surface.

4. The light-emitting device of claim 1, wherein the exit surface is positioned and shaped such that an angle of incidence on the exit surface of the scattered light passing through the optical interface that directly impinges on the exit surface is less than a critical angle for total internal reflection.

5. The light-emitting device of claim 1, wherein the exit surface is positioned and shaped such that an angle of incidence on the exit surface of the scattered light passing through the optical interface, that directly impinges on the exit surface or impinges on the exit surface after TIR off the side surface, is less than a critical angle for total internal reflection.

6. The light-emitting device of claim 1 further comprising a secondary reflector adjacent the extractor, the secondary reflector configured to redirect light output from the extractor.

7. The light-emitting device of claim 1, wherein the scattered light is isotropically scattered light.

8. The light-emitting device of claim 1, wherein the scattering element forms an enclosure into which the LEE emits light.

9. The light-emitting device of claim 1, wherein the reflective surface extends beyond the optical interface to the LEE, and forms an enclosure with the scattering element into which the LEE emits light.

10. A luminaire, comprising:
    a housing; and
    the light-emitting device of claim 1 supported by the housing.

11. The luminaire of claim 10, further comprising an optical element supported by the housing and configured to receive light from the light-emitting device, wherein the light emitted from the light-emitting device is further directed and shaped by the optical element.

12. The luminaire of claim 11, wherein the optical element is one of a reflector or a lens.

13. A light-emitting device comprising:
    a light-emitting element (LEE);
    a scattering element spaced apart from the LEE, configured to scatter received light and arranged to receive light from the LEE, the scattering element comprising phosphor, wherein
        the phosphor comprises inelastic scattering centers and elastic scattering centers,
        the inelastic scattering centers are configured to inelastically scatter at least some of the light received from the LEE, and
        the elastic scattering centers are configured to elastically scatter at least some of the light received from the LEE;
    an extractor arranged to form an optical interface with the scattering element through which the extractor receives light, the extractor including a side surface and an exit surface, the extractor being configured to emit light through the exit surface to an ambient environment, wherein the side surface is shaped such that an angle of incidence of light received directly from the optical interface is reflected via total internal reflection; and
    a reflective surface arranged between the optical interface and the side surface of the extractor, the reflective surface being arranged and configured to reflect light from the optical interface back into the extractor.

14. The light-emitting device of claim 13, wherein the scattering element is a shell.

15. The light-emitting device of claim 14, wherein the shell is shaped as a hemisphere.

16. The light-emitting device of claim 13, wherein the extractor further comprises a light guide, the light guide extending the side surface and comprising the exit surface.

17. The light-emitting device of claim 13, wherein the exit surface is positioned and shaped such that an angle of incidence on the exit surface of the scattered light passing through the optical interface that directly impinges on the exit surface is less than a critical angle for total internal reflection.

18. The light-emitting device of claim 13, wherein the exit surface is positioned and shaped such that an angle of incidence on the exit surface of the scattered light passing through the optical interface, that directly impinges on the exit surface or impinges on the exit surface after TIR off the side surface, is less than a critical angle for total internal reflection.

19. The light-emitting device of claim 13 further comprising a secondary reflector adjacent the extractor, the secondary reflector configured to redirect light output from the extractor.

20. The light-emitting device of claim 19, wherein the secondary reflector has an input aperture disposed proximate the exit surface.

21. The light-emitting device of claim 13, wherein the scattered light is isotropically scattered light.

22. The light-emitting device of claim 13, wherein the scattering element forms an enclosure into which the LEE emits light.

23. The light-emitting device of claim 13, wherein the reflective surface extends beyond the optical interface to the LEE, and forms an enclosure with the scattering element into which the LEE emits light.

24. The light-emitting device of claim 23, wherein the enclosure comprises a medium having a refractive index $n_0$ smaller than each of a refractive index $n_1$ of the scattering element and a refractive index $n_2$ of the extractor.

25. The light-emitting device of claim 24, wherein where $n_1 \leq n_2$.

26. A luminaire, comprising:
a housing; and
the light-emitting device of claim 13 supported by the housing.

27. The luminaire of claim 26, further comprising an optical element supported by the housing and configured to receive light from the light-emitting device, wherein the light emitted from the light-emitting device is further directed and shaped by the optical element.

28. The luminaire of claim 27, wherein the optical element is a reflector.

29. The luminaire of claim 27, wherein the optical element is a lens.

* * * * *